(12) United States Patent
Liu et al.

(10) Patent No.: US 11,222,789 B2
(45) Date of Patent: Jan. 11, 2022

(54) STAIRCASE STRUCTURE FOR THREE-DIMENSIONAL MEMORY

(71) Applicant: Yangtze Memory Technologies Co., Ltd., Hubei (CN)

(72) Inventors: Lei Liu, Hubei (CN); Wenxi Zhou, Hubei (CN); Zhiliang Xia, Hubei (CN)

(73) Assignee: Yangtze Memory Technologies Co., Ltd., Hubei (CN)

( * ) Notice: Subject to any disclaimer, the term of this patent is extended or adjusted under 35 U.S.C. 154(b) by 0 days.

(21) Appl. No.: 16/909,537

(22) Filed: Jun. 23, 2020

(65) Prior Publication Data

US 2021/0257220 A1    Aug. 19, 2021

Related U.S. Application Data

(63) Continuation of application No. PCT/CN2020/075684, filed on Feb. 18, 2020.

(51) Int. Cl.
*H01L 21/311* (2006.01)
*H01L 21/8234* (2006.01)
*H01L 27/11556* (2017.01)
*H01L 27/11582* (2017.01)

(52) U.S. Cl.
CPC ......... *H01L 21/31144* (2013.01); *H01L 21/823487* (2013.01); *H01L 27/11556* (2013.01); *H01L 27/11582* (2013.01)

(58) Field of Classification Search
None
See application file for complete search history.

(56) References Cited

U.S. PATENT DOCUMENTS

| | | | |
|---|---|---|---|
| 11,069,705 B2* | 7/2021 | Zhang | H01L 27/11582 |
| 2018/0331034 A1 | 11/2018 | Thimmegowda et al. | |
| 2020/0273874 A1 | 8/2020 | Zhang et al. | |
| 2020/0273875 A1 | 8/2020 | Zhang et al. | |

FOREIGN PATENT DOCUMENTS

| | | |
|---|---|---|
| CN | 109983577 A | 7/2019 |
| CN | 109997225 A | 7/2019 |
| TW | 200709392 A | 3/2007 |

\* cited by examiner

*Primary Examiner* — Hsien Ming Lee
(74) *Attorney, Agent, or Firm* — Sterne, Kessler, Goldstein & Fox P.L.L.C.

(57) ABSTRACT

Staircase structures for a three-dimensional (3D) memory device are disclosed. In some embodiments, the method includes disposing an alternating dielectric stack on a substrate with first and second dielectric layers alternatingly stacked on top of each other. Next, multiple division blocks can be formed in a staircase region. Each division block includes a first plurality of staircase steps in the first direction. Each staircase step in the first direction has two or more dielectric layer pairs. Then, a second plurality of staircase steps along a second direction, perpendicular to the first direction, can be formed. Each staircase step in the second direction includes the first plurality of staircase steps along the first direction. The method further includes forming an offset number of dielectric layer pairs between the multiple division blocks such that each dielectric layer pair is accessible from a top surface of a staircase step.

20 Claims, 13 Drawing Sheets

STAIRCASE STRUCTURE FOR THREE-DIMENSIONAL MEMORY

CROSS-REFERENCE TO RELATED APPLICATIONS AND INCORPORATION BY REFERENCE

This application claims priority to PCT/CN2020/075684 filed on Feb. 18, 2020, which is incorporated herein by reference in its entirety.

TECHNICAL FIELD

The present disclosure generally relates to the field of semiconductor technology, and more particularly, to a method for forming a three-dimensional (3D) memory.

BACKGROUND

As memory devices are shrinking to smaller die size to reduce manufacturing cost and increase storage density, scaling of planar memory cells faces challenges due to process technology limitations and reliability issues. A three-dimensional (3D) memory architecture can address the density and performance limitation in planar memory cells.

To further increase storage capacity in a 3D memory, the number of vertically stacked memory cells has been increased greatly. The dimensions of the staircase structure used to form contacts for memory cells are increased accordingly, which reduces the effective storage capacity per area for the 3D memory. Staircase structures with multiple divisions can reduce the lateral dimensions of the staircase structures by creating staircase steps in both x- and y-directions. To further reduce the lateral dimensions of the 3D memory, a need exists for an improvement in the staircase structure to achieve higher storage density.

BRIEF SUMMARY

Embodiments of a three-dimensional (3D) memory device and methods for forming the same are described in the present disclosure.

One aspect of the present disclosure provides a method for forming a three-dimensional (3D) memory device that includes disposing an alternating dielectric stack on a substrate. The alternating dielectric stack includes first and second dielectric layers alternatingly stacked on top of each other. The method also includes forming one or more offset steps between a first staircase region and a second staircase region, where the first and second staircase regions are located on opposite sides of a channel structure region. The method further includes forming first and second plurality of staircase steps along a first direction in the respective first and second staircase regions. Each of the first and second plurality of staircase steps has two or more dielectric layer pairs, and each dielectric layer pair has one first dielectric layer and one second dielectric layer. The method also includes forming third and fourth plurality of staircase steps along a second direction in the respective first and second staircase regions, where the second direction is perpendicular to the first direction. Each of the third plurality of staircase steps along the second direction includes the first plurality of staircase steps along the first direction, and each of the fourth plurality of staircase steps along the second direction includes the second plurality of staircase steps along the first direction.

In some embodiments, forming one or more offset steps includes forming a staircase mask on the alternating dielectric stack to cover the first staircase region and expose the second staircase region. The forming one or more offset steps further includes forming the second and fourth plurality of staircase steps located $N_{offset}$ number of dielectric layer pairs below the respective first and third plurality of staircase steps such that each dielectric layer pair is accessible from a top surface of a staircase step.

In some embodiments, forming the first and second plurality of staircase steps in the first direction includes forming two dielectric layer pairs in each of the first and second plurality of staircase steps. The forming one or more offset steps includes forming the second and fourth plurality of staircase steps located $N_{offset}$ number of dielectric layer pairs below the respective first and third plurality of staircase steps, where $N_{offset}$ is any odd integer.

In some embodiments, forming the first and second plurality of staircase steps along the first direction includes forming first and second sets of division blocks in the respective first and second staircase regions. The first and second sets of division blocks repeat in the first direction and extend in the second direction. Forming the first and second plurality of staircase steps along the first direction includes using a repetitive etch-trim process.

Second aspect of the present disclosure provides a method for forming a three-dimensional (3D) memory device that includes disposing an alternating dielectric stack on a substrate, where the alternating dielectric stack includes first and second dielectric layers alternatingly stacked on top of each other. One pair of the first and second dielectric layers has a dielectric layer pair. The method also includes forming multiple division blocks in a staircase region. The multiple division blocks repeat in a first direction and extend in a second direction perpendicular to the first direction. Each of the multiple division blocks includes a first plurality of staircase steps along the first direction, and each of the first plurality of staircase steps includes two or more dielectric layer pairs. The method further includes forming a second plurality of staircase steps along the second direction in the staircase region. Each of the second plurality of staircase steps along the second direction includes the first plurality of staircase steps along the first direction.

In some embodiments, the method further includes forming one or more offset steps between the multiple division blocks, wherein the one or more offset steps have an offset number $N_{offset}$ of the dielectric layer pairs such that each dielectric layer pair is accessible from a top surface of a staircase step. The forming one or more offset steps between the multiple division blocks includes forming a block mask that covers a first division block and exposes a second division block. The forming one or more offset steps also includes forming the second division block located below the first division block by an odd number of dielectric layer pairs when each of the first plurality of staircase steps in the first direction comprises two dielectric layer pairs.

Third aspect of the present disclosure provides a three-dimensional (3D) memory structure that includes an alternating dielectric stack disposed on a substrate, wherein the alternating dielectric stack includes alternatingly stacked first and second dielectric layers. The first dielectric layer is different from the second dielectric layer. The 3D memory structure also includes first and second sets of division blocks formed at edges of the alternating dielectric stack in first and second staircase regions, respectively, where the first and second staircase regions are located on opposite sides of a channel structure region. The second set of division blocks are located below the first set of division blocks by a first offset number of dielectric layer pairs. Each dielectric layer pair includes one first dielectric layer and one second dielectric layer. Each of the first and second sets of division blocks includes a first plurality of staircase steps in a first direction and a second plurality of staircase steps in a second direction perpendicular to the first direction. Each of the first plurality of staircase steps in the first direction has two or more dielectric layer pairs.

In some embodiments, the first plurality of staircase steps in the first direction are symmetrically distributed around the second direction on both sides of the second plurality of the staircase steps.

In some embodiments, the first plurality of staircase steps in the first direction includes N number of staircase steps. Each of the first plurality of staircase steps has L number of dielectric layer pairs. Each of the second plurality of staircase steps in the second direction has M number of dielectric layer pairs, where M is a product of N and L.

In some embodiments, the first offset number of dielectric layer pairs between the first and second sets of division blocks is an odd integer when each of the first plurality of staircase steps in the first direction comprises two dielectric layer pairs.

In some embodiments, the 3D memory structure further includes a second offset number of dielectric layer pairs, where a first division block of the first or second set of division blocks is located below a second division block of the first or second set of division blocks by the second offset number of dielectric layer pairs.

Fourth aspect of the present disclosure provides a three-dimensional (3D) memory structure that includes an alternating dielectric stack disposed on a substrate, where the alternating dielectric stack includes alternatingly stacked first and second dielectric layers. The first dielectric layer is different from the second dielectric layer. The 3D memory structure also includes multiple division blocks formed at an edge of the alternating dielectric stack in a staircase region, where the staircase region is located between two channel structure regions. The multiple division blocks has an offset number of dielectric layer pairs. Each dielectric layer pair has one first dielectric layer and one second dielectric layer and is accessible from a top surface of a staircase step. Each division block includes a first plurality of staircase steps in a first direction and a second plurality of staircase steps in a second direction perpendicular to the first direction. Each of the first plurality of staircase steps in the first direction includes two or more dielectric layer pairs.

In some embodiments, the first plurality of staircase steps in the first direction has N number of staircase steps. Each of the first plurality of staircase steps has L number of dielectric layer pairs. Each of the second plurality of staircase steps in the second direction includes M number of dielectric layer pairs, wherein M is a product of N and L.

In some embodiments, the offset number of dielectric layer pairs between a first division block and a second division block is an odd integer when each of the first plurality of staircase steps in the first direction includes two dielectric layer pairs.

Other aspects of the present disclosure can be understood by those skilled in the art in light of the description, the claims, and the drawings of the present disclosure.

BRIEF DESCRIPTION OF THE DRAWINGS

The accompanying drawings, which are incorporated herein and form a part of the specification, illustrate embodiments of the present disclosure and, together with the description, further serve to explain the principles of the present disclosure and to enable a person skilled in the pertinent art to make and use the present disclosure.

Figure 1:
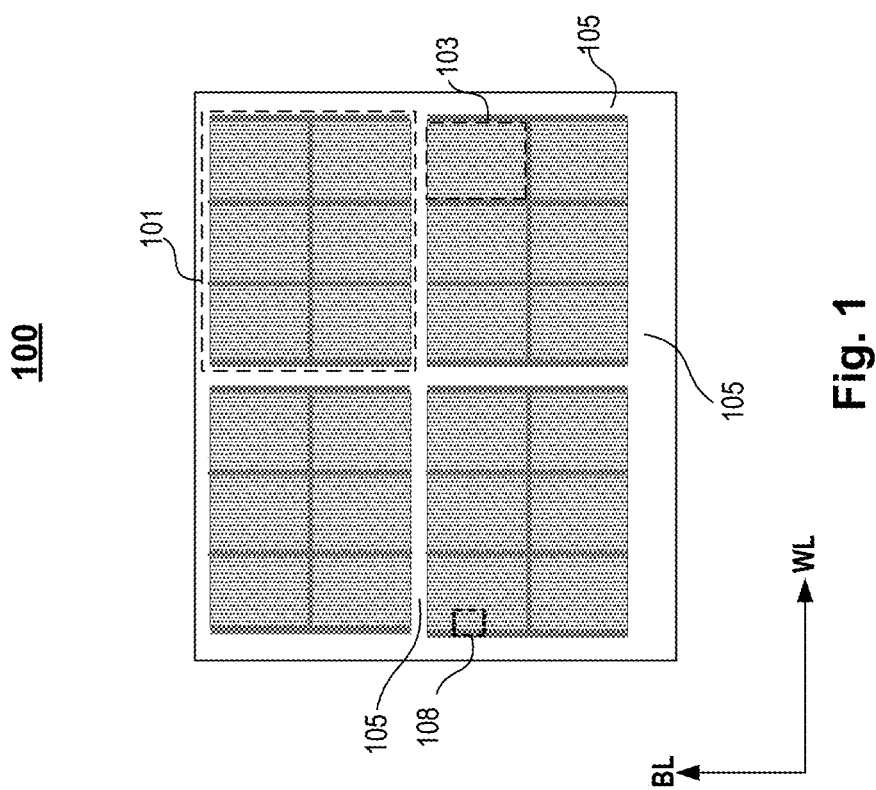
FIG. 1 illustrates a schematic top-down view of an exemplary three-dimensional (3D) memory die, according to some embodiments of the present disclosure.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements. The drawing in which an element first appears is indicated by the leftmost digit(s) in the corresponding reference number.

Embodiments of the present disclosure will be described with reference to the accompanying drawings.

DETAILED DESCRIPTION

Although specific configurations and arrangements are discussed, it should be understood that this is done for illustrative purposes only. A person skilled in the pertinent art will recognize that other configurations and arrangements can be used without departing from the spirit and scope of the present disclosure. It will be apparent to a person skilled in the pertinent art that the present disclosure can also be employed in a variety of other applications.

It is noted that references in the specification to "one embodiment," "an embodiment," "an example embodiment," "some embodiments," etc., indicate that the embodiment described can include a particular feature, structure, or characteristic, but every embodiment can not necessarily include the particular feature, structure, or characteristic. Moreover, such phrases do not necessarily refer to the same embodiment. Further, when a particular feature, structure or characteristic is described in connection with an embodiment, it would be within the knowledge of a person skilled in the pertinent art to affect such feature, structure or characteristic in connection with other embodiments whether or not explicitly described.

In general, terminology can be understood at least in part from usage in context. For example, the term "one or more" as used herein, depending at least in part upon context, can be used to describe any feature, structure, or characteristic in a singular sense or can be used to describe combinations of features, structures or characteristics in a plural sense. Similarly, terms, such as "a," "an," or "the," again, can be understood to convey a singular usage or to convey a plural usage, depending at least in part upon context. In addition, the term "based on" can be understood as not necessarily intended to convey an exclusive set of factors and may, instead, allow for existence of additional factors not necessarily expressly described, again, depending at least in part on context.

It should be readily understood that the meaning of "on," "above," and "over" in the present disclosure should be interpreted in the broadest manner such that "on" not only means "directly on" something, but also includes the meaning of "on" something with an intermediate feature or a layer therebetween. Moreover, "above" or "over" not only means "above" or "over" something, but can also include the meaning it is "above" or "over" something with no intermediate feature or layer therebetween (i.e., directly on something).

Further, spatially relative terms, such as "beneath," "below," "lower," "above," "upper," and the like, can be used herein for ease of description to describe one element or feature's relationship to another element(s) or feature(s) as illustrated in the figures. The spatially relative terms are intended to encompass different orientations of the device in use or process step in addition to the orientation depicted in the figures. The apparatus can be otherwise oriented (rotated 90 degrees or at other orientations) and the spatially relative descriptors used herein can likewise be interpreted accordingly.

As used herein, the term "substrate" refers to a material onto which subsequent material layers are added. The substrate includes a "top" surface and a "bottom" surface. The top surface of the substrate is typically where a semiconductor device is formed, and therefore the semiconductor device is formed at a top side of the substrate unless stated otherwise. The bottom surface is opposite to the top surface and therefore a bottom side of the substrate is opposite to the top side of the substrate. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer has a top side and a bottom side where the bottom side of the layer is relatively close to the substrate and the top side is relatively away from the substrate. A layer can extend over the entirety of an underlying or overlying structure, or can have an extent less than the extent of an underlying or overlying structure. Further, a layer can be a region of a homogeneous or inhomogeneous continuous structure that has a thickness less than the thickness of the continuous structure. For example, a layer can be located between any set of horizontal planes between, or at, a top surface and a bottom surface of the continuous structure. A layer can extend horizontally, vertically, and/or along a tapered surface. A substrate can be a layer, can include one or more layers therein, and/or can have one or more layer thereupon, thereabove, and/or therebelow. A layer can include multiple layers. For example, an interconnect layer can include one or more conductive and contact layers (in which contacts, interconnect lines, and/or vertical interconnect accesses (VIAs) are formed) and one or more dielectric layers.

In the present disclosure, for ease of description, "tier" is used to refer to elements of substantially the same height along the vertical direction. For example, a word line and the underlying gate dielectric layer can be referred to as "a tier," a word line and the underlying insulating layer can together be referred to as "a tier," word lines of substantially the same height can be referred to as "a tier of word lines" or similar, and so on.

As used herein, the term "nominal/nominally" refers to a desired, or target, value of a characteristic or parameter for a component or a process step, set during the design phase of a product or a process, together with a range of values above and/or below the desired value. The range of values can be due to slight variations in manufacturing processes or tolerances. As used herein, the term "about" indicates the value of a given quantity that can vary based on a particular technology node associated with the subject semiconductor device. Based on the particular technology node, the term "about" can indicate a value of a given quantity that varies within, for example, 10-30% of the value (e.g., ±10%, ±20%, or ±30% of the value).

In the present disclosure, the term "horizontal/horizontally/lateral/laterally" means nominally parallel to a lateral surface of a substrate, and the term "vertical" or "vertically" means nominally perpendicular to the lateral surface of a substrate.

As used herein, the term "3D memory" refers to a three-dimensional (3D) semiconductor device with vertically oriented strings of memory cell transistors (referred to herein as "memory strings," such as NAND strings) on a laterally-oriented substrate so that the memory strings extend in the vertical direction with respect to the substrate.

FIG. 1 illustrates a top-down view of an exemplary three-dimensional (3D) memory device 100, according to some embodiments of the present disclosure. The 3D memory device 100 can be a memory chip (package), a memory die or any portion of a memory die, and can include one or more memory planes 101, each of which can include a plurality of memory blocks 103. Identical and concurrent operations can take place at each memory plane 101. The memory block 103, which can be megabytes (MB) in size, is the smallest size to carry out erase operations. Shown in FIG. 1, the exemplary 3D memory device 100 includes four memory planes 101 and each memory plane 101 includes six memory blocks 103. Each memory block 103 can include a plurality of memory cells, where each memory cell can be addressed through interconnections such as bit lines and word lines. The bit lines and word lines can be laid out perpendicularly (e.g., in rows and columns, respectively), forming an array of metal lines. The direction of bit lines and word lines are labeled as "BL" and "WL" in FIG. 1. In this disclosure, memory block 103 is also referred to as a "memory array" or "array." The memory array is the core area in a memory device, performing storage functions.

The 3D memory device 100 also includes a periphery region 105, an area surrounding memory planes 101. The periphery region 105 contains many digital, analog, and/or mixed-signal circuits to support functions of the memory array, for example, page buffers, row and column decoders and sense amplifiers. Peripheral circuits use active and/or passive semiconductor devices, such as transistors, diodes, capacitors, resistors, etc., as would be apparent to a person of ordinary skill in the art.

It is noted that, the arrangement of the memory planes 101 in the 3D memory device 100 and the arrangement of the memory blocks 103 in each memory plane 101 illustrated in FIG. 1 are only used as an example, which does not limit the scope of the present disclosure.

Figure 2:
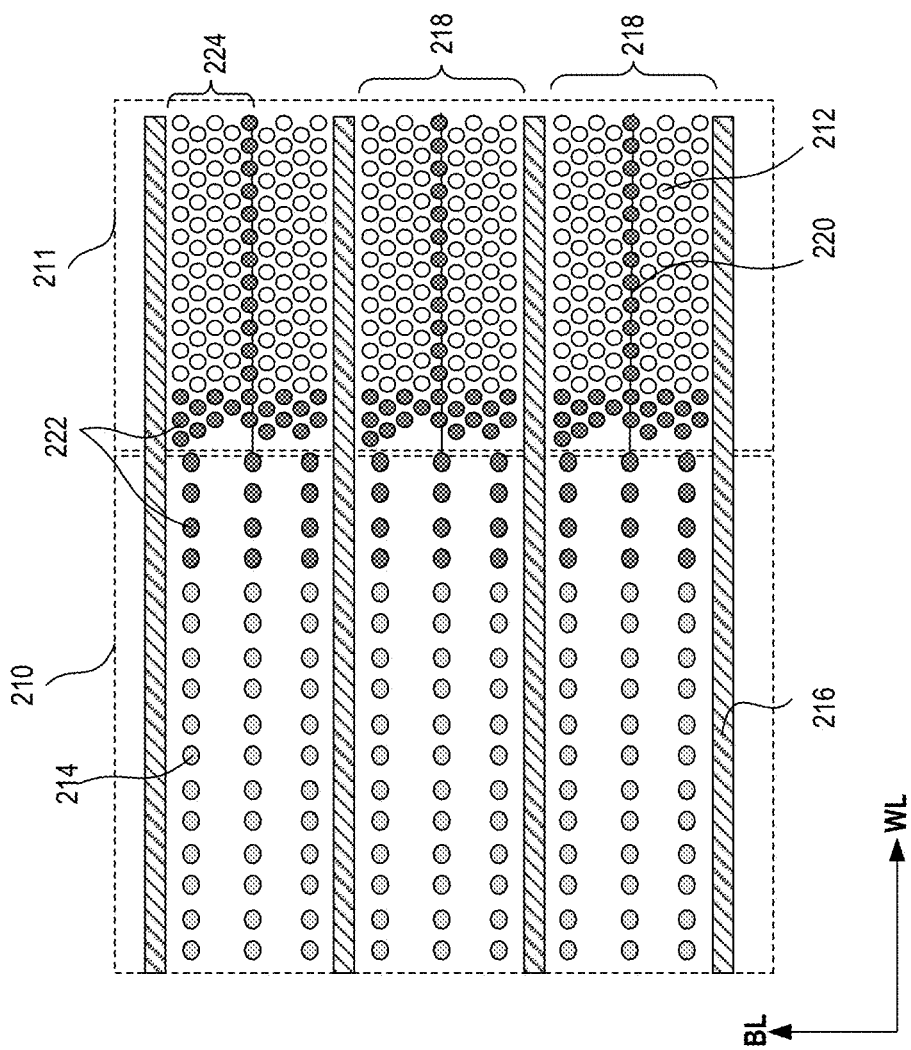
FIG. 2 illustrates a schematic top-down view of a region of 3D memory die, according to some embodiments of the present disclosure.

Referring to FIG. 2, an enlarged top-down view of a region 108 in FIG. 1 is illustrated, according to some embodiments of the present disclosure. The region 108 of the 3D memory device 100 can include a staircase region 210 and a channel structure region 211. The channel structure region 211 can include an array of memory strings 212, each including a plurality of stacked memory cells. The staircase region 210 can include a staircase structure and an array of contact structures 214 formed on the staircase structure. In some embodiments, a plurality of slit structures 216, extending in WL direction across the channel structure region 211 and the staircase region 210, can divide a memory block into multiple memory fingers 218. At least some slit structures 216 can function as the common source contact for an array of memory strings 212 in channel structure regions 211. A top select gate cut 220 can be disposed, for example, in the middle of each memory finger 218 to divide a top select gate (TSG) of the memory finger 218 into two portions, and thereby can divide a memory finger into two memory slices 224, where memory cells in a memory slice 224 that share the same word line form a programmable (read/write) memory page. While erase operation of a 3D NAND memory can be carried out at memory block level, read and write operations can be carried out at memory page level. A memory page can be kilobytes (KB) in size. In some embodiments, region 108 also includes dummy memory strings 222 for process variation control during fabrication and/or for additional mechanical support.

Figure 3:
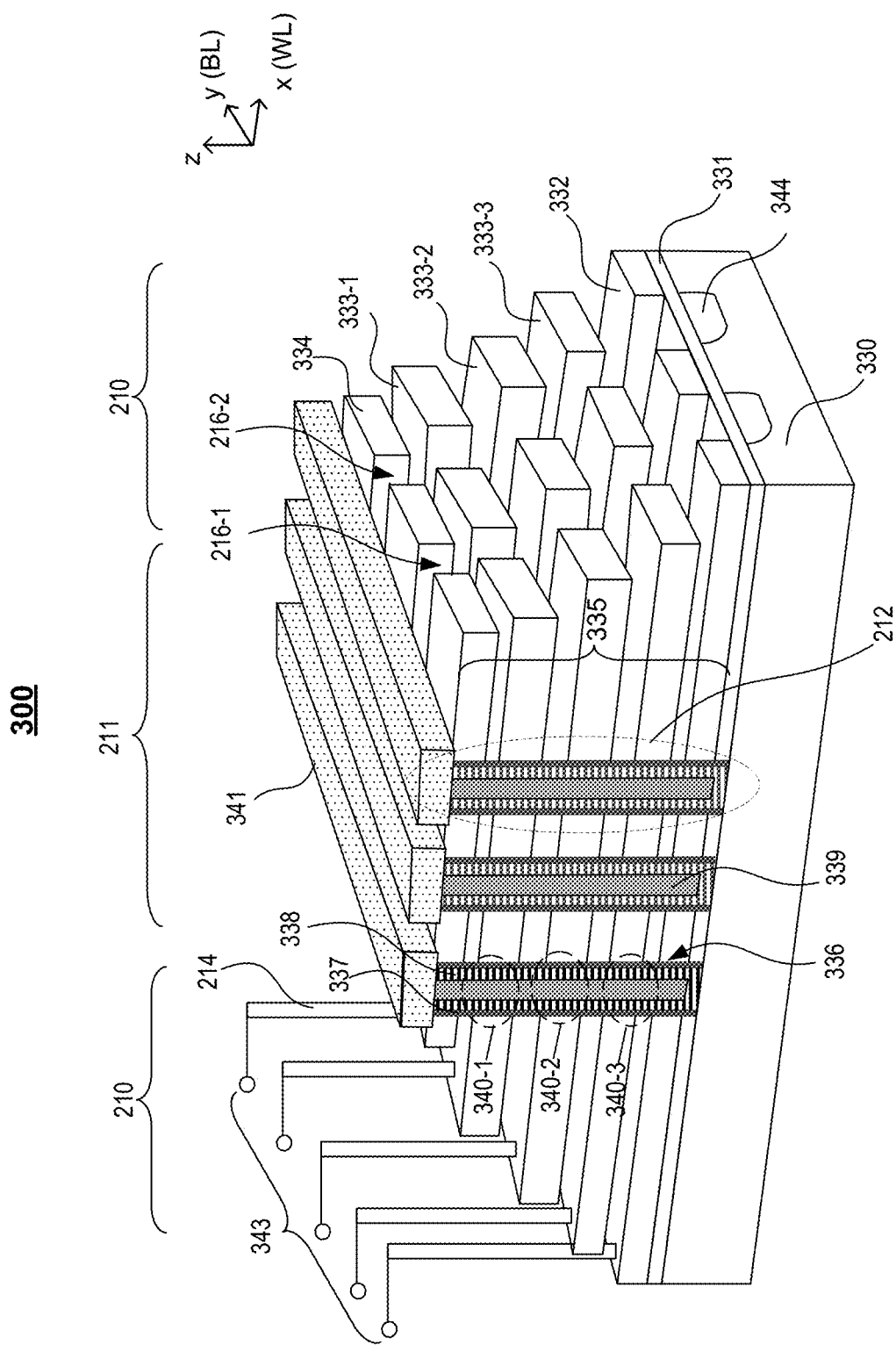
FIG. 3 illustrates a perspective view of a portion of an exemplary 3D memory array structure, in accordance with some embodiments of the present disclosure.

FIG. 3 illustrates a perspective view of a portion of an exemplary three-dimensional (3D) memory array structure 300, according to some embodiments of the present disclosure. The memory array structure 300 includes a substrate 330, an insulating film 331 over the substrate 330, a tier of lower select gates (LSGs) 332 over the insulating film 331, and a plurality of tiers of control gates 333, also referred to as "word lines (WLs)," stacking on top of the LSGs 332 to form a film stack 335 of alternating conductive and dielectric layers. The dielectric layers adjacent to the tiers of control gates are not shown in FIG. 3 for clarity.

The control gates of each tier are separated by slit structures 216-1 and 216-2 through the film stack 335. The memory array structure 300 also includes a tier of top select gates (TSGs) 334 over the stack of control gates 333. The stack of TSG 334, control gates 333 and LSG 332 is also referred to as "gate electrodes." The memory array structure 300 further includes memory strings 212 and doped source line regions 344 in portions of substrate 330 between adjacent LSGs 332. Each memory strings 212 includes a channel hole 336 extending through the insulating film 331 and the film stack 335 of alternating conductive and dielectric layers. Memory strings 212 also includes a memory film 337 on a sidewall of the channel hole 336, a channel layer 338 over the memory film 337, and a core filling film 339 surrounded by the channel layer 338. A memory cell 340 can be formed at the intersection of the control gate 333 and the memory string 212. The memory array structure 300 further includes a plurality of bit lines (BLs) 341 connected with the memory strings 212 over the TSGs 334. The memory array structure 300 also includes a plurality of metal interconnect lines 343 connected with the gate electrodes through a plurality of contact structures 214. The edge of the film stack 335 is configured in a shape of staircase to allow an electrical connection to each tier of the gate electrodes.

In FIG. 3, for illustrative purposes, three tiers of control gates 333-1, 333-2, and 333-3 are shown together with one tier of TSG 334 and one tier of LSG 332. In this example, each memory string 212 can include three memory cells 340-1, 340-2 and 340-3, corresponding to the control gates 333-1, 333-2 and 333-3, respectively. In some embodiments, the number of control gates and the number of memory cells can be more than three to increase storage capacity. The memory array structure 300 can also include other structures, for example, TSG cut, common source contact and dummy memory string. These structures are not shown in FIG. 3 for simplicity.

To pursue higher storage capacity in a 3D memory, the number of vertically stacked memory cells has been increased greatly. As a result, the number of control gates or word lines 333 has been increased greatly. To form electrical contact (e.g., contact structure 214) for each of the word lines 333, the staircase region 210 has been extended laterally from either side of the channel structure region 211. The increased dimension of staircase region reduces the effective storage capacity per unit area and thus increases cost per bit of the 3D memory.

To shrink the dimensions of the staircase region, staircase structures with multiple divisions can be used to form contact structures on staircase steps in both x- and y-directions. 3D memory with staircase structures of multiple divisions can include a set of staircase steps along x-direction, where each staircase step in the x-direction corresponds to another set of staircase steps along y-direction. Typically, each staircase step along y-direction includes one pair of conductive and dielectric layers such that each control gate 333 can be connected to a corresponding word line.

However, as the film stack 335 of alternating conductive and dielectric layers increases, manufacturing processes (e.g., forming channel holes 336 in FIG. 3 through the entire film stack 335) become more challenging due to increased aspect ratio. To reduce the total thickness of the film stack 335, the thicknesses of the conductive and dielectric layers are scaled down. However, thinner thickness leads to smaller staircase step height, especially the ones along y-direction with one pair of conductive and dielectric layers. Generally, it is difficult to form an isolation spacer on a sidewall of a small staircase step. Therefore, a need exists for an improvement in the staircase structure for a 3D memory.

Figure 4:
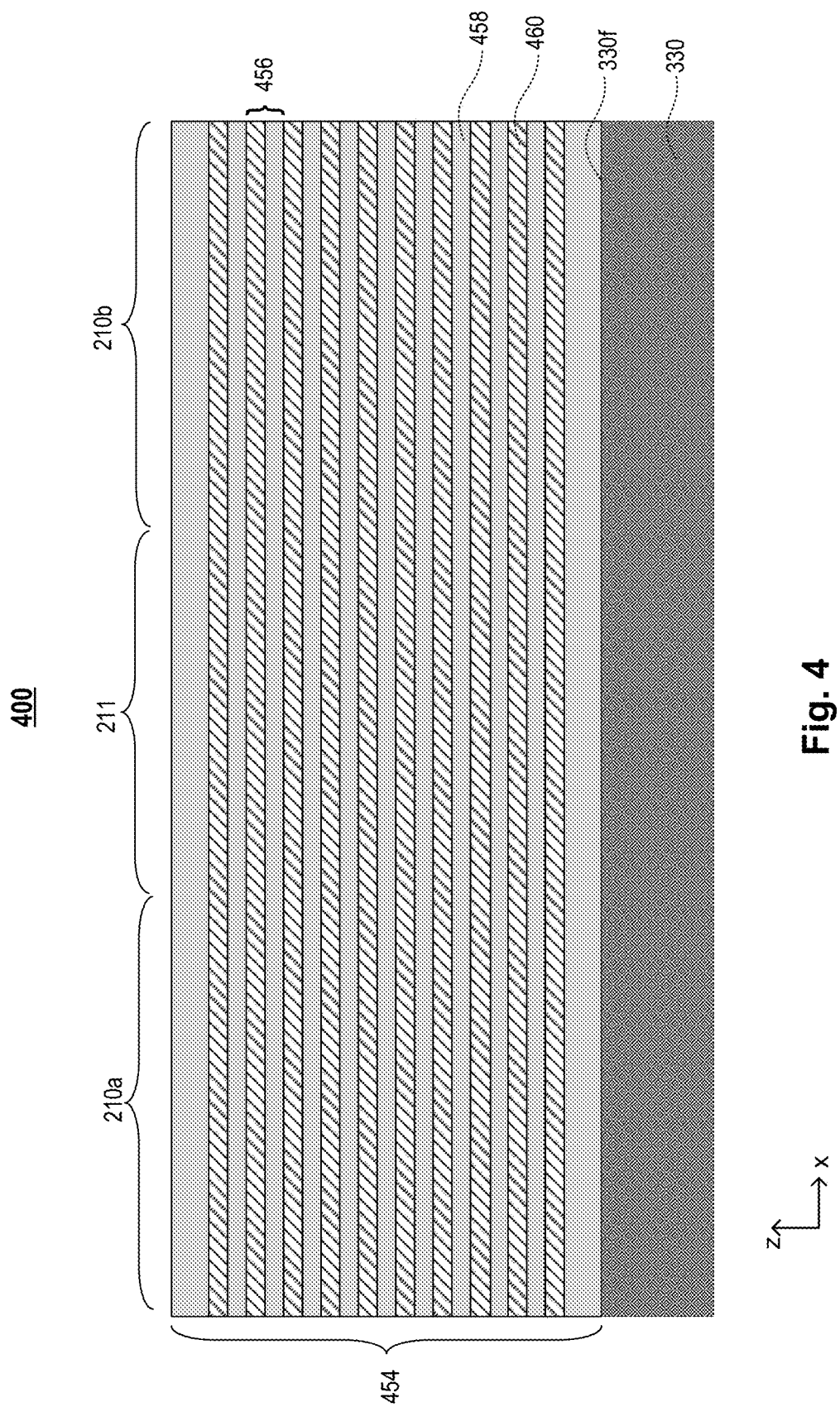
FIG. 4 illustrates a cross-sectional view of an exemplary 3D memory structure, according to some embodiments of the present disclosure.

FIG. 4 illustrates a cross-sectional view of an exemplary structure 400 of a three-dimensional memory device, according to some embodiments, where the structure 400 includes a substrate (e.g., the substrate 330 in FIG. 3) and an alternating dielectric stack 454. The cross-sectional view of FIG. 4 is along WL direction in FIG. 2A, i.e., along x-direction in FIG. 3.

The substrate 330 can provide a platform for forming subsequent structures. In some embodiments, the substrate 330 can be any suitable semiconductor substrate having any suitable semiconductor materials, such as monocrystalline, polycrystalline or single crystalline semiconductors. For example, the substrate 330 can include silicon, silicon germanium (SiGe), germanium (Ge), silicon on insulator (SOI), germanium on insulator (GOI), gallium arsenide (GaAs), gallium nitride, silicon carbide, III-V compound, or any combinations thereof. In some embodiments, the substrate 330 can include a layer of semiconductor material formed on a handle wafer, for example, glass, plastic, or another semiconductor substrate.

A front surface 330f of the substrate 330 is also referred to as a "main surface" or a "top surface" of the substrate herein. Layers of materials can be disposed on the front surface 330f of the substrate 330. A "topmost" or "upper" layer is a layer farthest or farther away from the front surface 330f of the substrate. A "bottommost" or "lower" layer is a layer closest or closer to the front surface 330f of the substrate.

In some embodiments, the alternating dielectric stack 454 includes a plurality of dielectric layer pairs 456 alternatingly stacked on top of each other, where each dielectric layer pair 456 includes a first dielectric layer 458 and a second dielectric layer 460 (also referred to as "sacrificial layer") that is different from the first dielectric layer 458. The alternating dielectric stack 454 extends in a lateral direction that is parallel to the front surface 330f of the substrate 330.

In the alternating dielectric stack 454, first dielectric layers 458 and second dielectric layers 460 alternate in a vertical direction, perpendicular to the substrate 330. In the other words, each second dielectric layer 460 can be sandwiched between two first dielectric layers 458, and each first dielectric layer 458 can be sandwiched between two second dielectric layers 460 (except the bottommost and the topmost layer).

The formation of the alternating dielectric stack 454 can include disposing the first dielectric layers 458 to each have the same thickness or to have different thicknesses. Example thicknesses of the first dielectric layers 458 can range from 10 nm to 500 nm, preferably about 25 nm. Similarly, the second dielectric layer 460 can each have the same thickness or have different thicknesses. Example thicknesses of the second dielectric layer 460 can range from 10 nm to 500 nm, preferably about 35 nm. It should be understood that the number of dielectric layer pairs 456 in FIG. 4 is for illustrative purposes only and that any suitable number of layers may be included in the alternating dielectric stack 454.

In some embodiments, the first dielectric layer 458 includes any suitable insulating materials, for example, silicon oxide, silicon oxynitride, silicon nitride, TEOS or silicon oxide with F-, C-, N-, and/or H-incorporation. The first dielectric layer 458 can also include high-k dielectric materials, for example, hafnium oxide, zirconium oxide, aluminum oxide, tantalum oxide, or lanthanum oxide films. In some embodiments, the first dielectric layer 458 can be any combination of the above materials.

The formation of the first dielectric layer 458 on the substrate 330 can include any suitable deposition methods such as, chemical vapor deposition (CVD), physical vapor deposition (PVD), plasma-enhanced CVD (PECVD), rapid thermal chemical vapor deposition (RTCVD), low pressure chemical vapor deposition (LPCVD), sputtering, metal-organic chemical vapor deposition (MOCVD), atomic layer deposition (ALD), high-density-plasma CVD (HDP-CVD), thermal oxidation, nitridation, any other suitable deposition method, and/or combinations thereof.

In some embodiments, the second dielectric layer 460 includes any suitable material that is different from the first dielectric layer 458 and can be removed selectively with respect to the first dielectric layer 458. For example, the second dielectric layer 460 can include silicon oxide, silicon oxynitride, silicon nitride, TEOS, poly-crystalline silicon, poly-crystalline germanium, poly-crystalline germanium-silicon, and any combinations thereof. In some embodiments, the second dielectric layer 460 also includes amorphous semiconductor materials, such as amorphous silicon or amorphous germanium. The second dielectric layer 460 can be disposed using a similar technique as the first dielectric layer 458, such as CVD, PVD, ALD, thermal oxidation or nitridation, or any combination thereof.

In some embodiments, the first dielectric layer 458 can be silicon oxide and the second dielectric layer 460 can be silicon nitride.

In some embodiments, the alternating dielectric stack 454 can include layers in addition to the first dielectric layer 458 and the second dielectric layer 460, and can be made of different materials and/or with different thicknesses.

In addition to the alternating dielectric stack 454, in some embodiments, peripheral devices (not shown) can be formed in the periphery region 105 (see FIG. 1) on the front surface 330f of the substrate 330. In some embodiments, active device areas (not shown) can also be formed in the memory blocks 103 (see FIG. 1) on the front surface 330f of the substrate 330. In some embodiments, the substrate 330 can further include an insulating film 331 on the front surface 330f (not shown in FIG. 4). The insulating film 331 can be made of the same or different material from the alternating dielectric stack 454.

The peripheral devices can include any suitable semiconductor devices, for example, metal oxide semiconductor field effect transistors (MOSFETs), diodes, resistors, capacitors, etc. The peripheral devices can be used in the design of digital, analog and/or mixed signal circuits supporting the storage function of the memory core, for example, row and column decoders, drivers, page buffers, sense amplifiers, timing and controls.

The active device areas in the memory blocks are surrounded by isolation structures, such as shallow trench isolation. Doped regions, such as p-type doped and/or n-type doped wells, can be formed in the active device area according to the functionality of the array devices in the memory blocks.

In some embodiments, the structure 400 of the 3D memory device can include a channel structure region 211. The structure 400 also includes first and second staircase regions 210a and 210b on opposite sides of the channel structure region 211 along x-direction. The channel structure region 211 can be used to form an array of memory strings, each including a plurality of stacked memory cells, as described above in connection with FIGS. 2 and 3. The first and second staircase regions 210a and 210b can be used to form staircase structures in the subsequent processes, as described in details below. It is noted that the dimensions and configuration of the components shown in FIG. 4 should not limit the scope of the present disclosure.

Figure 5:
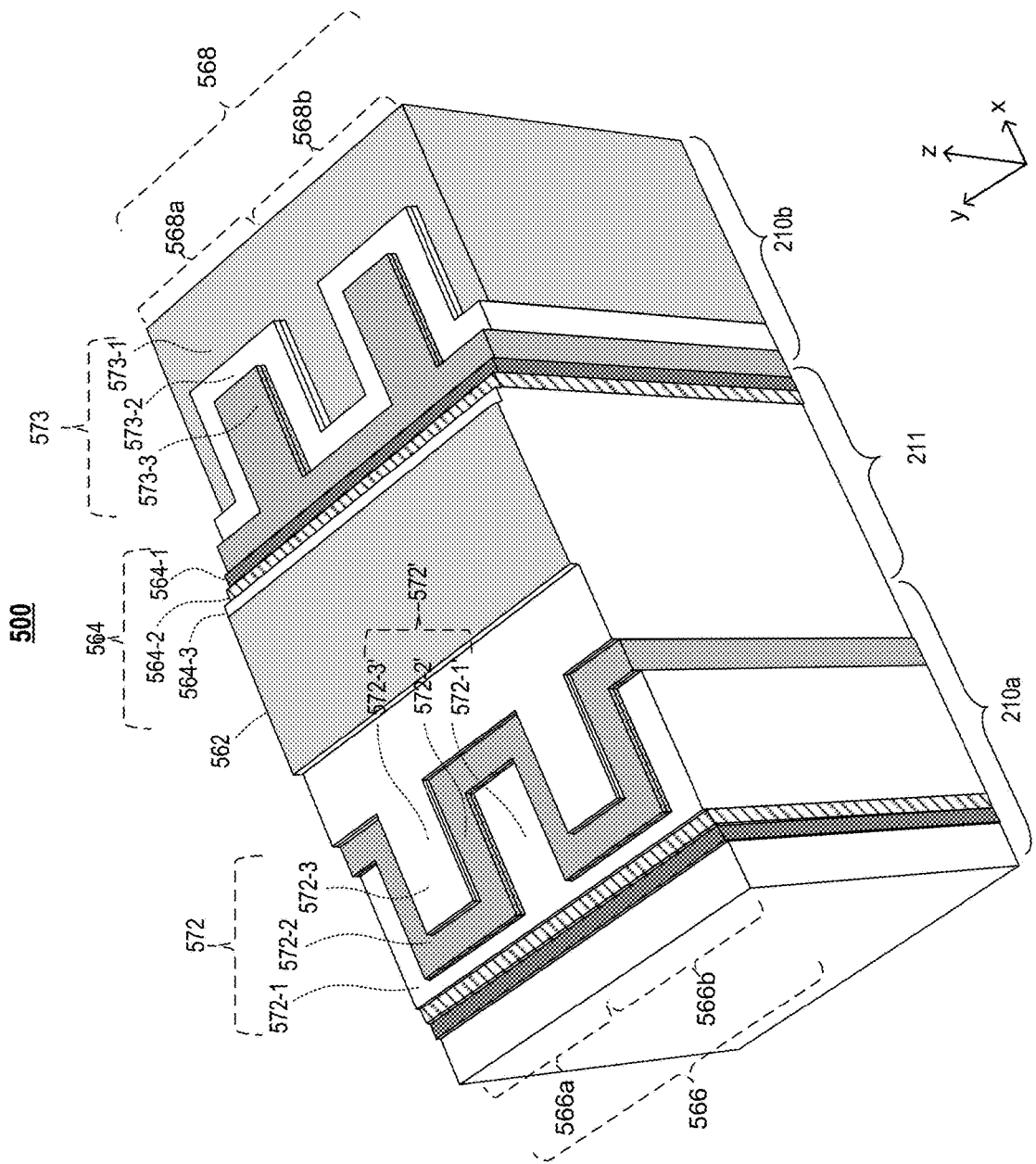
FIG. 5 illustrates a perspective view of an exemplary 3D memory structure, according to some embodiments of the present disclosure.
Figure 6:
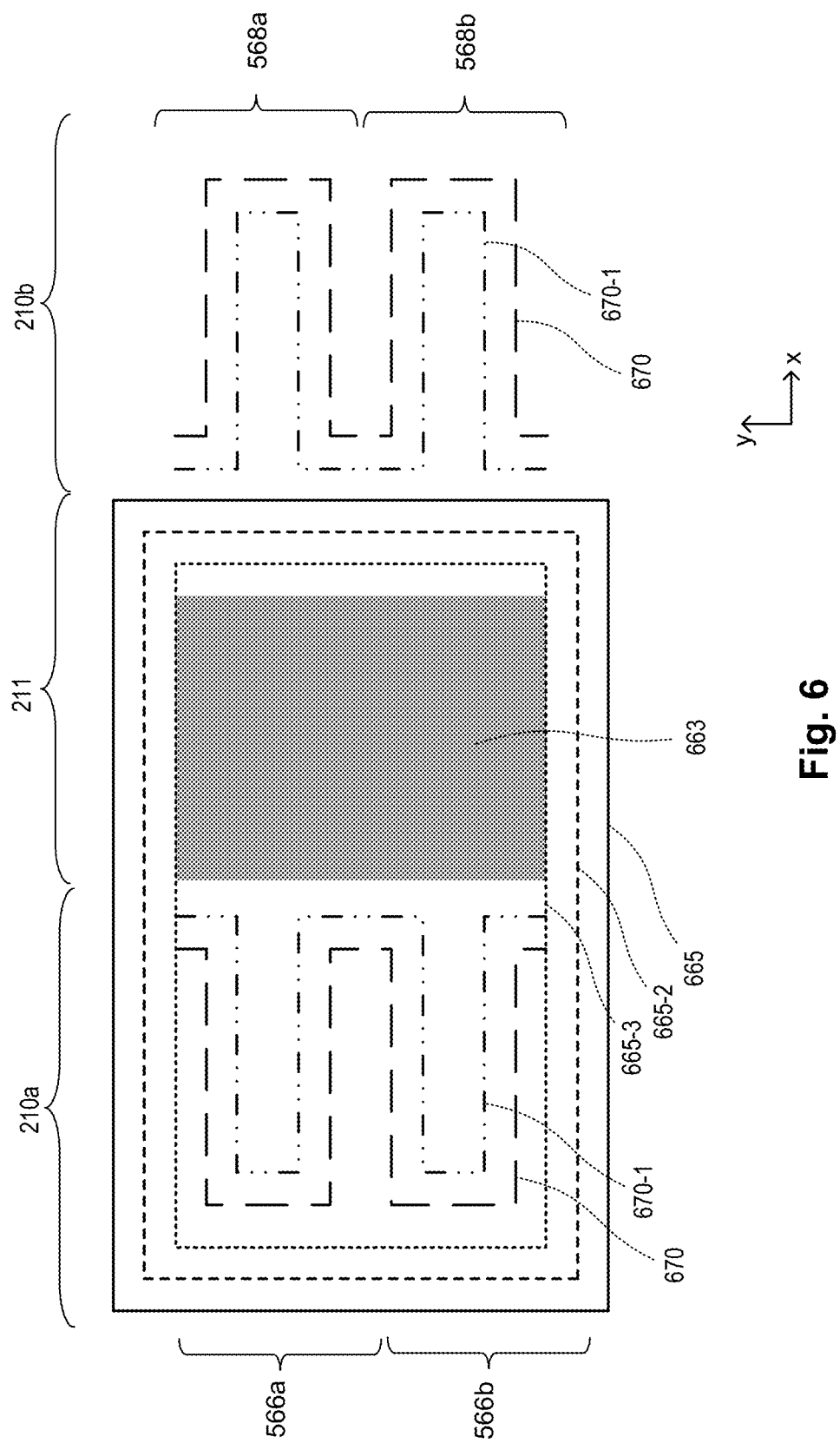
FIG. 6 illustrates a top-down view of masks used to form the 3D memory structure in FIG. 5, according to some embodiments of the present disclosure.

FIG. 5 illustrates a perspective view of a 3D memory structure 500, and FIG. 6 shows a top-down view of exemplary masks used in creating the 3D memory structure 500, according to some embodiments of the present disclosure.

In some embodiments, the 3D memory structure 500 includes a top step 562, which can be formed to define the channel structure region 211 by using a first staircase mask 663 (shown in FIG. 6). The first staircase mask 663 can be used to cover the channel structure region 211 and expose the first and second staircase regions 210a and 210b. In some embodiments, the first staircase mask 663 can include a photoresist or carbon-based polymer material, and can be formed using a patterning process such as lithography. In some embodiments, the first staircase mask 663 can also include a hard mask, such as silicon oxide, silicon nitride, TEOS, silicon-containing anti-reflective coating (SiARC), amorphous silicon, or polycrystalline silicon. The hard mask can be patterned using etching process such as reactive-ion-etching (RIE) using $O_2$ or $CF_4$ chemistry. Furthermore, the first staircase mask 663 can include any combination of photoresist and hard mask.

In some embodiments, one or more dielectric layer pairs (e.g., the dielectric layer pair 456 in FIG. 4) can be etched with the first staircase mask 663. The etching process for the first dielectric layer 458 can have a high selectivity over the second dielectric layer 460, and/or vice versa. Accordingly, an underlying dielectric layer pair 456 can function as an etch-stop layer. As a result, the top step 562 can be formed in the channel structure region 211, as shown in FIG. 5.

In some embodiments, the top step 562 can be etched using an anisotropic etching such as a reactive ion etching (RIE) or other dry etching processes. In some embodiments, the first dielectric layer 458 is silicon oxide. In this example, the etching of silicon oxide can include RIE using fluorine-based gases such as carbon-fluorine ($CF_4$), hexafluoroethane ($C_2F_6$), $CHF_3$, or $C_3F_6$ and/or any other suitable gases. In some embodiments, the silicon oxide layer can be removed by wet chemistry, such as hydrofluoric acid or a mixture of hydrofluoric acid and ethylene glycol. In some embodiments, a timed-etch approach can be used. In some embodiments, the second dielectric layer 460 is silicon nitride. In this example, the etching of silicon nitride can include RIE using $O_2$, $N_2$, $CF_4$, $NF_3$, $Cl_2$, HBr, $BCl_3$, and/or combinations thereof. The methods and etchants to remove a dielectric layer should not be limited by the embodiments of the present disclosure. In some embodiments, after the etching process, the first staircase mask 663 can be removed by using techniques such as dry etching with $O_2$ or $CF_4$ plasma, or wet etching with resist/polymer stripper, for example solvent based chemicals.

In some embodiments, the 3D memory structure 500 also includes a plurality of staircase steps 564 for top select gates (TSG) (e.g., TSG 334 in FIG. 3) by using a second staircase mask 665 (see FIG. 6). For illustration purpose, three staircase steps 564-1, 564-2 and 564-3 for TSG are shown in FIG. 5. However, the number of the staircase steps 564 for TSG is not limited and can be any suitable number. In some embodiments, the second staircase mask 665 covers the channel structure region 211. In some embodiments, the second staircase mask 665 also covers the first staircase region 210a, and only exposes the staircase region 210b (as shown in FIG. 6). The second staircase mask 665 can be formed by using similar materials and methods as the first staircase mask 663.

The plurality of staircase steps 564-1, 564-2 and 564-3 for TSG can be formed by applying a repetitive etch-trim process on the alternating dielectric stack 454 in FIG. 4 using the second staircase mask 665. The etch-trim process includes an etching process and a trimming process. During the etching process, at least one dielectric layer pair 456 in the exposed staircase region 210b can be removed. The etch depth determines a step height of the staircase steps 564 for TSG. In some embodiments, each staircase step 564 for TSG can include one dielectric layer pair 456. Techniques used for etching dielectric layer pairs 456 for the staircase steps 564 can be similar to the etching process for the top step 562 described above.

The trimming process includes applying a suitable etching process (e.g., an isotropic dry etch or a wet etch) to laterally pull back the second staircase mask 665 in the x-y plane (e.g., the x-y plane parallel to the front surface $330f$ of the substrate 330 in FIG. 3). As shown in FIG. 6, the second staircase mask 665 can be pulled back to form pattern 665-2 and then pulled back further to form pattern 665-3. The pattern of the second staircase mask 665 corresponds to the staircase step 564-1 for TSG in FIG. 5, while patterns 665-2 and 665-3 correspond to staircase steps 564-2 and 564-3 for TSG. The trimming process determines step widths of the staircase steps 564 for TSG. In some embodiments, the step widths of the plurality of staircase steps 564-1, 564-2, 564-3 for TSG can be between 10 nm and 100 nm. In some embodiments, the trimming process can include dry etching, such as RIE using $O_2$, Ar, $N_2$, etc. During the etch-trim process, some of the second staircase mask 665 can be consumed, and the thickness of the second staircase mask 665 can be reduced. After forming the plurality of staircase steps 564 for TSG, the second staircase mask 665 can be removed by dry or wet etching, for example, RIE with $O_2$ or $CF_4$, wet etching with resist/polymer stripper.

As shown in FIG. 5, the 3D memory structure 500 also includes a first set of division blocks 566 (e.g., 566a and 566b) in the first staircase region 210a and a second set of division blocks 568 (e.g., 568a and 568b) in the second staircase region 210b. In some embodiments, the second set of division blocks 568 in the second staircase region 210b can be lower than the first set of division blocks 566 in the first staircase region 210a. In the example shown in FIG. 5, the second set of division blocks 568 is lower than the first set of division blocks 566 by the number of staircase steps 564 for TSG. In the example of FIG. 5, the second set of division blocks 568 locates three steps lower than the first set of division blocks 566. In some embodiments, the second set of division blocks 568 can be lowered by a number of offset steps $N_{offset}$ from the first set of division blocks 566, or vice versa. The number of offset steps $N_{offset}$ between the first and second sets of division blocks 566/568 can be created through adjusting the number of staircase steps 564 for the TSG, forming one or more dummy staircase steps in the first or second staircase regions 210a/210b with the second staircase mask 665. The number of offset steps $N_{offset}$ can also be created with an additional mask, where the additional mask can be used to block the first staircase region 210a and expose the second staircase region 210b, or vice versa.

Figure 7:
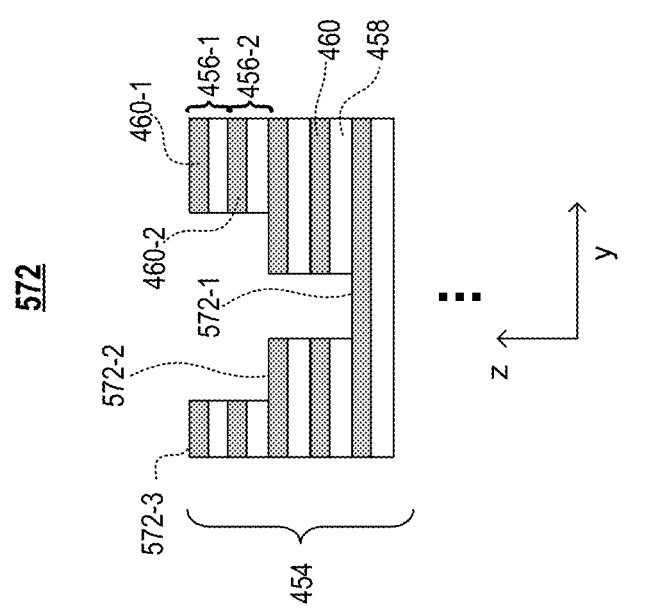
FIG. 7 illustrates a cross-sectional view of the 3D memory structure in FIG. 5, according to some embodiments of the present disclosure.

In some embodiments, the 3D memory structure 500 also includes a first staircase structure 572 and a second staircase structure 573 formed in the first and second staircase regions 210a and 210b, respectively. The first staircase structure 572 includes a first plurality of staircase steps 572-1, 572-2, 572-3 along y-direction, and the second staircase structure 573 includes a second plurality of staircase steps 573-1, 573-2, 573-3 along y-direction. In the present disclosure, each of the first and second plurality of staircase steps 572-1, 572-2, 572-3, and 573-1, 573-2, 573-3 of the 3D memory structure 500 includes two or more dielectric layer pairs (e.g., the dielectric layer pair 456 shown in FIG. 4). A cross-sectional view of the first staircase structure 572 is shown in FIG. 7, according to some embodiments of the present disclosure. In this example, each of the first plurality of staircase steps 572-1, 572-2 and 572-3 includes two dielectric layer pairs 456, where each dielectric layer pair 456 includes one first dielectric layer 458 and one second dielectric layer 460.

In some embodiments, the first and second staircase structures 572 and 573 can be formed simultaneously by using a staircase division pattern (SDP) mask 670 and a repetitive etch-trim process. As shown in FIG. 6, the SDP mask 670 covers the channel structure region 211 and a portion of the first and second staircase regions 210a and 210b adjacent to the channel structure region 211. The SDP mask 670 can include multiple block patterns repeated along the y-direction. As an example, two block patterns are shown in each of the staircase region 210a/210b in FIG. 6, where the two block patterns in the first staircase region 210a corresponds to the first set of division blocks 566a/566b in FIG. 5, and the two block patterns in the first staircase region 210a corresponds to the second set of division blocks 568a/568b.

In some embodiments, the staircase division pattern mask 670 can include a photoresist or carbon-based polymer material, and can be formed using a patterning process such as lithography. In some embodiments, the staircase division pattern mask 670 can also include a hard mask, such as silicon oxide, silicon nitride, TEOS, silicon-containing anti-reflective coating (SiARC), amorphous silicon, or polycrystalline silicon. The hard mask can be patterned using etching process such as reactive-ion-etching (RIE) using $O_2$ or $CF_4$ chemistry. Furthermore, the staircase division pattern mask 670 can include any combination of photoresist and hard mask.

The first and second staircase structures 572 and 573, shown in FIG. 5, can be formed by applying a repetitive etch-trim process with the SDP mask 670 in FIG. 6. The etch-trim process includes an etching process and a trimming process. During the etching process, a portion of the alternating dielectric stack 454 with exposed surface can be removed (see FIG. 7). The etch depth determines a step height of the first and second plurality of staircase steps 572-1, 572-2, 572-3, and 573-1, 573-2, 573-3. In some embodiments, each of the first and second plurality of staircase steps 572-1, 572-2, 572-3, and 573-1, 573-2, 573-3 can include two dielectric layer pairs 456. The etching process for the first dielectric layer 458 can have a high selectivity over the second dielectric layer 460, and/or vice versa. Accordingly, an underlying dielectric layer pair 456 can function as an etch-stop layer. By controlling the etching process, one staircase step with two dielectric layer pairs 456 can be formed during each etch-trim cycle.

In some embodiments, the etching process for the first and second staircase structure 572 and 573 can include any suitable dry and/or wet etching processes. In some embodiments, the first dielectric layer 458 is silicon oxide. In this example, the etching of silicon oxide can include RIE using fluorine-based gases such as carbon-fluorine ($CF_4$), hexafluoroethane ($C_2F_6$), $CHF_3$, or $C_3F_6$ and/or any other suitable gases. In some embodiments, the silicon oxide layer can be removed by wet chemistry, such as hydrofluoric acid or a mixture of hydrofluoric acid and ethylene glycol. In some embodiments, a timed-etch approach can be used. In some embodiments, the second dielectric layer 460 is silicon nitride. In this example, the etching of silicon nitride can include RIE using $O_2$, $N_2$, $CF_4$, $NF_3$, $Cl_2$, HBr, $BCl_3$, and/or combinations thereof. The methods and etchants to remove a single layer should not be limited by the embodiments of the present disclosure.

The trimming process can include laterally pulling back the SDP mask 670 in the x-y plane by an etching process (e.g., isotropic dry etching or wet etching). In some embodiments, the trimming process can include dry etching, such as RIE using $O_2$, Ar, $N_2$, etc. From the top-down view in FIG. 6, the SDP mask 670 can be etched inwardly from an initial edge of the SDP mask 670 towards a final edge 670-1 in both of the first and second staircase regions 210a and 210b. The lateral pull-back dimension at etch trimming process determines a width of the first and second plurality of the staircase steps 572-1, 572-2, 572-3 and 573-1, 573-2 and 573-3. In some embodiments, the first and second plurality of the staircase steps 572-1, 572-2, 572-3 and 573-1, 573-2 and 573-3 can each have a different or same width. In some embodiments, trimming of the SDP mask 670 can be isotropic in all directions in the x-y plane such that the widths of the first and second plurality of the staircase steps 572-1, 572-2, 572-3 and 573-1, 573-2 and 573-3 in the x- and y-directions can be the same, and in a range between 10 nm and 100 nm.

By repeating etch-trim process twice, the first staircase structure 572 including three staircase steps 572-1, 572-2, and 573-3 can be formed in the first staircase region 210a, and the second staircase structure 573 including three staircase steps 573-1, 573-2, and 573-3 can be formed in the second staircase region 210b, as shown in FIG. 5. The staircase step 572-1 of the first staircase structure 572 is lower than the staircase step 573-1 of the second staircase structure 573 by three staircase steps due to the staircase steps 564 for TSG. Similarly, the staircase steps 572-2 and 572-3 are lower than the staircase steps 573-2 and 573-3 by three staircase steps, respectively.

As discussed previously, the number of offset steps $N_{offset}$ between the first and second sets of division blocks 566 and 568, or between the first and second staircase structures 572 and 573, can be adjusted through the number of staircase steps 564 for the TSG and/or dummy staircase steps in the first or second staircase regions 210a/210b by using the second staircase mask 665 and an etching process. In some embodiments, each staircase step of the first and second staircase structures 572/573 can includes two dielectric layer pairs 456. In this example, the number of offset steps $N_{offset}$ can be one or three or any odd integer.

As shown in FIG. 5, the first and second sets of division blocks 566/568 can each include two block patterns 566a/566b and 568a/568b that are extended along the x-direction and repeated along the y-direction. Each block pattern 566a, 566b, 568a, 568b can be used to form a division staircase structure in the subsequent processes. It is noted that, the number of block patterns in the first and second sets of division blocks 566/568 is not limited to two and can be any suitable number.

In some embodiments, each of the block patterns 566a/566b can include two first staircase structures 572 and 572' that are symmetrically distributed around x-axis. The first plurality of staircase steps 572-1, 572-2 and 572-3 correspond to 572-1', 572-2' and 572-3', respectively, where 572-3 and 572-3' refer to the same staircase step. Similarly each of the block patterns 568a and 568b includes two second plurality of staircase steps that are symmetrically distributed around x-axis.

During the etch-trim process, some of the SDP mask 670 can be consumed, and the thickness of the SDP mask 670 can be reduced. After the etch-trim process, the SDP mask 670 can be removed by using techniques such as dry etching with $O_2$ or $CF_4$ plasma, or wet etching with resist/polymer stripper, for example solvent based chemicals.

Figure 8:
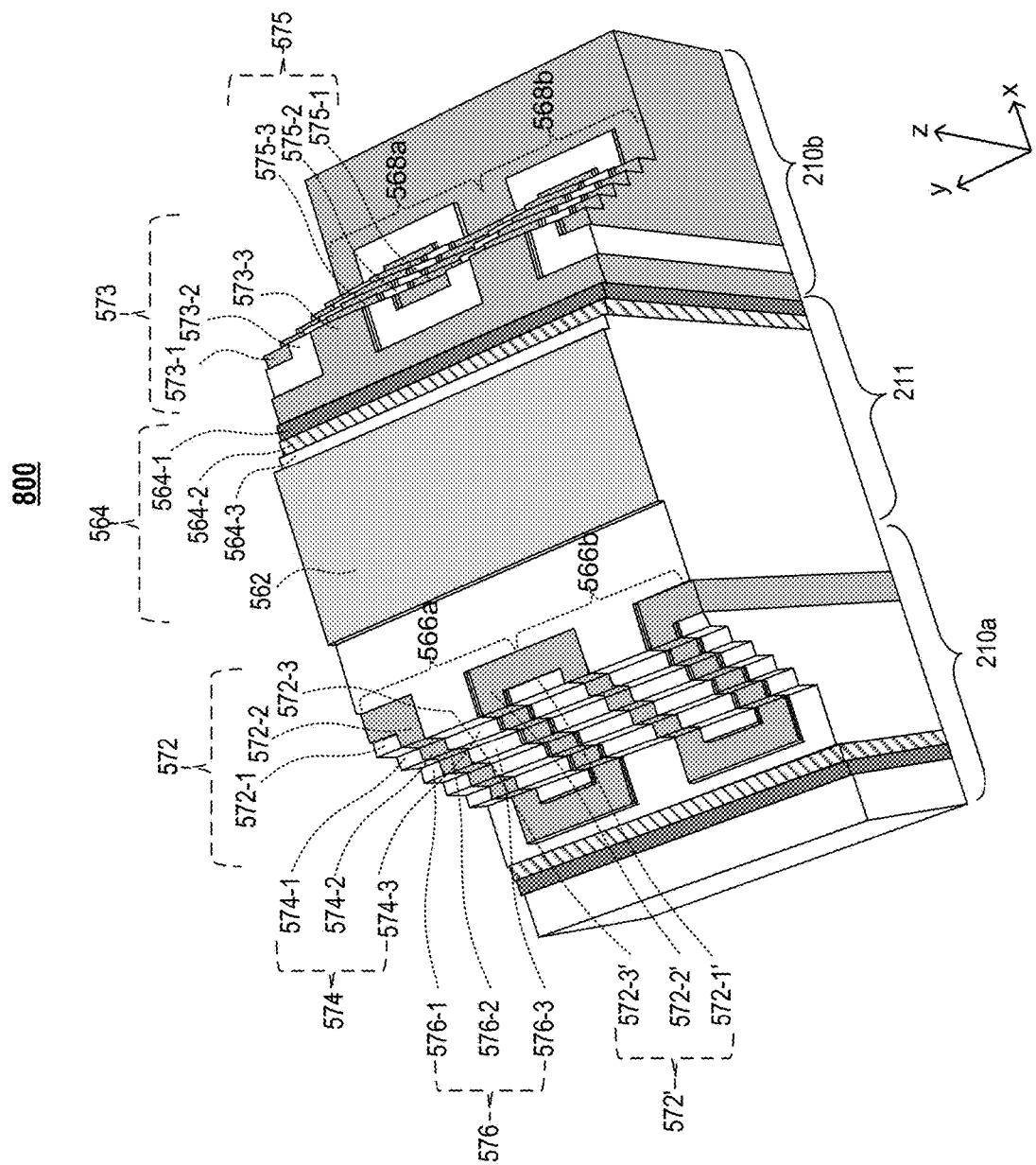
FIG. 8 illustrates a perspective view of an exemplary 3D memory structure, according to some embodiments of the present disclosure.
Figure 9:
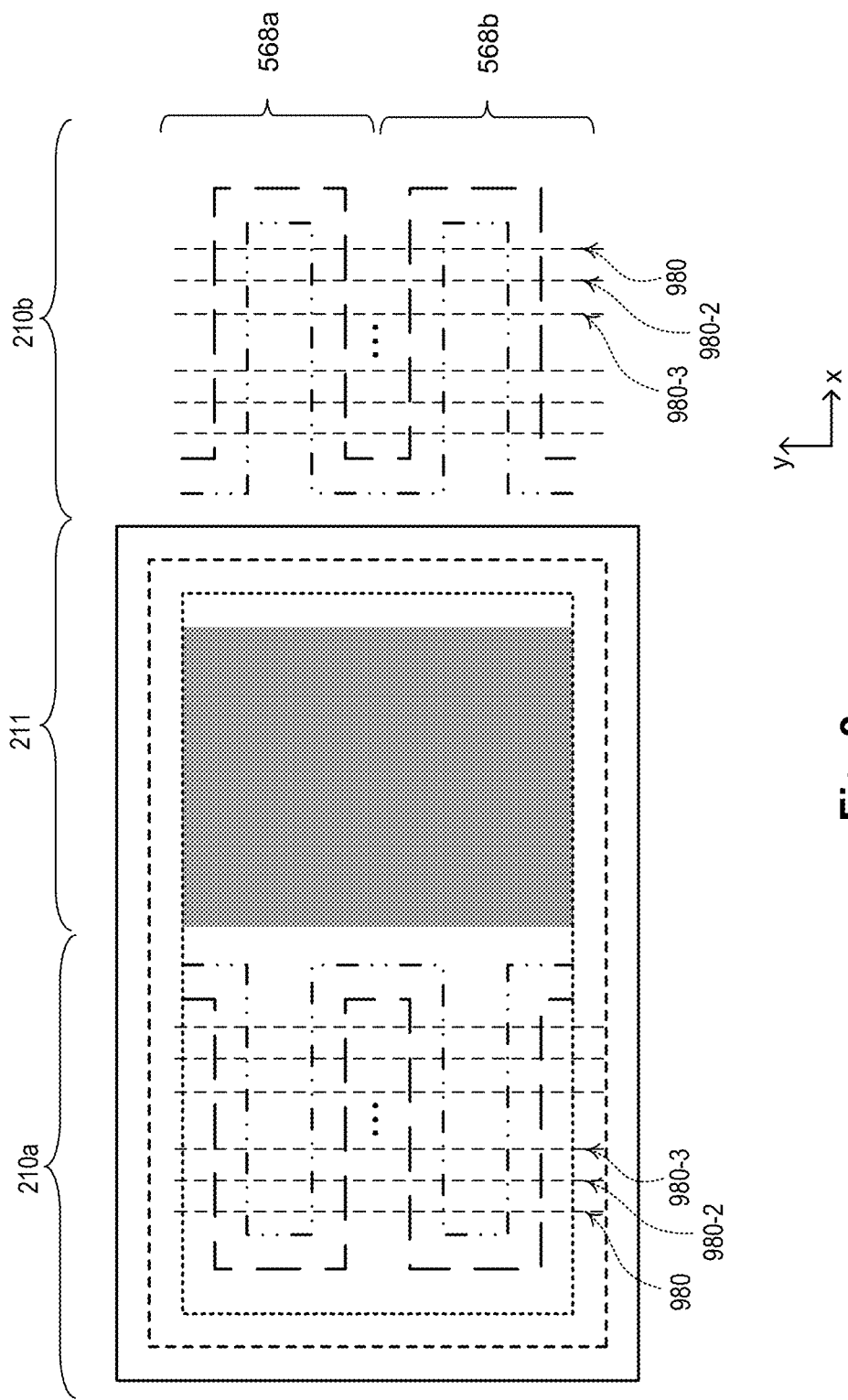
FIG. 9 illustrates a top-down view of masks used to form the 3D memory structure in FIG. 8, according to some embodiments of the present disclosure.
Figure 10:
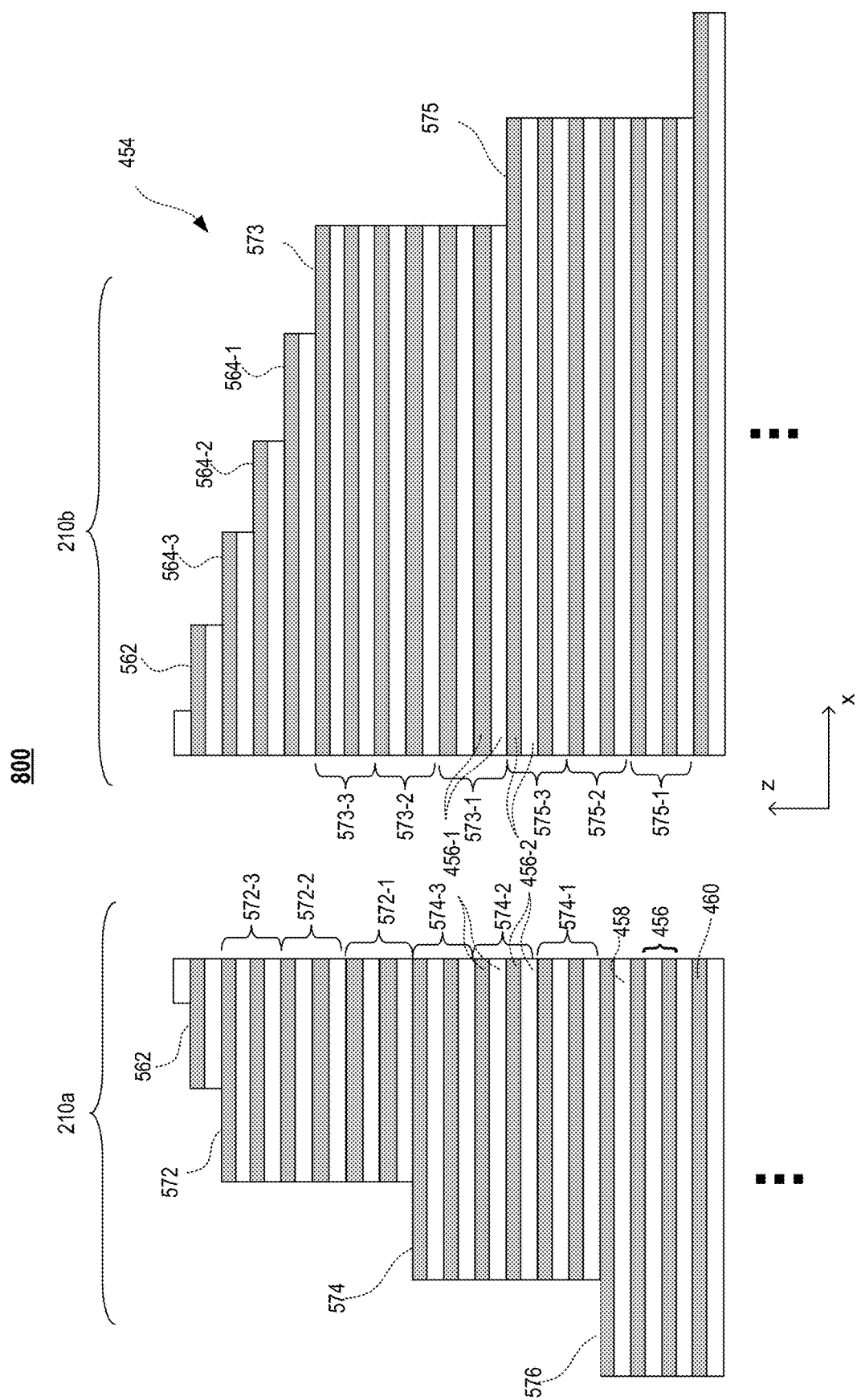
FIG. 10 illustrates a cross-sectional view of the 3D memory structure in FIG. 8, according to some embodiments of the present disclosure.

FIG. 8 illustrates a perspective view a 3D memory structure 800, FIG. 9 illustrates a top-down view of exemplary masks used to form the 3D memory structure 800, and FIG. 10 illustrates a cross-sectional view of the 3D memory structure 800 along x-direction, according to some embodiments of the present disclosure.

As shown in FIGS. 8 and 10, the 3D memory structure 800 includes a third plurality of staircase steps 572, 574, 576, etc., in the first staircase region 210a that are arranged along the x-direction. Each of the third plurality of staircase steps (e.g., staircase step 574) includes a plurality of staircase steps along y-direction (e.g., 574-1, 574-2 and 574-3) that are similar to the first plurality of staircase steps 572-1, 572-2 and 572-3. The 3D memory structure 800 also includes a fourth plurality of staircase steps 573, 575, etc., in the second staircase region 210b that are arranged along the x-direction. Similarly, each of the fourth staircase structure (e.g., staircase step 575) includes a plurality of staircase steps along y-direction (e.g., 575-1, 575-2 and 575-3) that are similar to the second plurality of staircase steps 573-1, 573-3, and 573-3.

In some embodiments, the third plurality of staircase steps 572, 574, 576, . . . , and the fourth plurality of staircase steps 573, 575, etc., can be formed simultaneously by using a third staircase mask 980 and a repetitive etch-trim process. As shown in FIG. 9, the third staircase mask 980 covers the channel structure region 211 and a portion of the first and second staircase regions 210a and 210b. The third staircase mask 980 can include similar materials and can be formed by using similar techniques as the second staircase mask 665.

The etch-trim process includes an etching process and a trimming process. During the etching process, multiple alternating dielectric layer pairs 456 (see FIG. 10) can be removed in the exposed first and second staircase regions 210a and 210b that are not covered by the third staircase mask 980. The etch depth determines a step height of a staircase step along x-direction. In some embodiments, the staircases can be etched using an anisotropic etching such as a reactive ion etching (RIE) or other dry etching processes, where the techniques for the etching can be similar to the etching process used for the first and second staircase structures 572 and 573. For example, the etching process for the first dielectric layer 458 can have a high selectivity over the second dielectric layer 460, and/or vice versa. Accordingly, an underlying dielectric layer pair 456 can function as an etch-stop layer. By controlling the etching process, the alternating dielectric stack 454 can be etched one dielectric layer pair 456 at a time.

In some embodiments, the first and second staircase structures 572 and 573, having respective first and second plurality of staircase steps in y-direction (e.g., 572-1, 572-2, 572-3, and 573-1, 573-2, 573-3), can be formed prior to forming the third and fourth plurality of staircase steps in x-direction. In this example, during the repetitive etch-trim process to form the third and fourth plurality of staircase steps along x-direction, patterns of the first and second plurality of staircase steps in y-direction (e.g., 572-1, 572-2, 572-3, and 573-1, 573-2, 573-3 in FIGS. 5 and 7) can be transferred simultaneously to the underlying dielectric layer pairs, including dimensions in x-y plane and step height in z-direction. As a result, a plurality of staircase steps along both x- and y-directions can be formed for the 3D memory structure 800.

The trimming process includes applying a suitable etching process (e.g., an isotropic dry etch or a wet etch) on the third staircase mask 980 such that the third staircase mask 980 can be pulled back laterally in the x-y plane (e.g., parallel to the front surface 330f of the substrate 330 in FIG. 3). As shown in FIG. 9, the third staircase mask 980 can be etched incrementally and inwardly from initial pattern defined by, for example, photoresist from lithography. After a trimming process, an edge of the third staircase mask 980 can be pulled back towards the channel structure region 211 to form a new edge 980-2. When another cycle of etch-trim process is performed, another new edge 980-3 closer to the channel structure region 211 can be formed. The lateral pull-back dimension in the x-direction at the trimming process determines a width of the third and fourth plurality of staircase steps in the x-direction. In some embodiments, each staircase step can have a different or same width in the x-direction.

By repeating etch-trim process and using the first staircase mask 980, the third plurality of staircase steps 572, 574, 576, etc., and fourth plurality of staircase steps 573, 575, etc., can be formed from top to bottom in the respective first and second staircase regions 210a and 210b. Accordingly, each of the first sets of division blocks 566a, 566b, etc., can include the third plurality of staircase steps 572, 574, 576, etc., extending along x-direction with the first plurality of staircase steps symmetrically distributed on both sides. For example, staircase steps 572-1', 572-2' and 572-3' are symmetric to staircase steps 572-1, 572-2 and 572-3 around x-direction. Similarly, each of the second sets of division blocks 568a, 568b, etc., can include fourth plurality of staircase steps 572, 574, 576, etc., extend along x-direction with the second plurality of staircase steps symmetrically distributed on both sides.

In some embodiments, each of the first staircase structures in the y-direction (e.g., the first staircase structure 572) includes three staircase steps (e.g., 572-1, 572-2 and 572-3), where each staircase step (e.g., 572-1, 572-2 and 572-3) includes two dielectric layer pairs 456 (see an example in FIGS. 5 and 7). In this example, each of the third plurality of staircase steps 572, 574, 576, etc., in the x-direction includes six dielectric layer pairs 456. Similarly, each of the second staircase structures in the y-direction (e.g., the second staircase structure 573) also includes three staircase steps (e.g., 573-1, 573-2 and 573-3), where each staircase step (e.g., 573-1, 573-2 and 573-3) includes two dielectric layer pairs 456. In this example, each of the fourth plurality of staircase steps 573, 575, etc., in the x-direction includes six dielectric layer pairs 456.

It is noted that the number of staircase steps in the first and second staircase structures are not so limiting. In some embodiments, the first and second staircase structures in the y-direction can include N number of staircase steps, where each staircase step in the y-direction can have L number of dielectric layer pairs. In this example, each of the staircase step in the x-direction can have N times L (i.e., N*L) number of dielectric layer pairs.

It is noted that, between the third plurality of staircase steps 572, 574, 576, etc., and the fourth plurality of staircase steps 573, 575, etc., there can be a vertical offset (e.g., in the z-direction). The number of offset steps $N_{offset}$ between the third plurality of staircase steps 572, 574, 576, etc., and the fourth plurality of staircase steps 573, 575 . . . in the x-direction can also be determined by the number of staircase steps 564 for TSG or some other dummy staircase steps created in one of the staircase regions 210a or 210b. As shown in FIGS. 8 and 10, the number of offset steps $N_{offset}$ between the third and fourth plurality of staircase steps in x-direction is three, which is determined by the staircase steps 564-1, 564-2, and 564-3 for TSG. In some embodiments, $N_{offset}$ can be one or any odd integer when each of the staircase step in y-direction (e.g., the first plurality of staircase steps 572-1, 572-2 and 572-3) includes two dielectric layer pairs 456.

In some embodiments, a control gate (e.g., the control gate 333 in FIG. 3), formed by replacing the second dielectric layer 460 with a conductive material in the subsequent processes, can be electrically connected from a top surface of a staircase step in the 3D memory structure 800. Therefore, it is necessary to access or expose each second dielectric layer that will be used for control gate in the subsequent processes. When each of the staircase steps in y-direction includes two dielectric layer pairs 456, for example the first plurality of staircase steps 572-1, 572-2 and 572-3 in FIGS. 5 and 7, the second dielectric layer 460-1 of an upper dielectric layer pair 456-1 can be exposed while the second dielectric layer 460-2 of a lower dielectric layer pair 456-2 is covered under the upper dielectric layer pair 456-1. Because staircase steps in the first staircase region 210a and the second staircase region 210b can have an offset in z-direction, the lower dielectric layer pair 460-2 in the first staircase region 210a can become an upper dielectric layer pair in the second staircase region 210b and can be accessed from a top surface of the staircase step. For example, in FIGS. 8 and 10, each staircase step in x-direction (e.g., 572, 574, etc.) includes three staircase steps (e.g., 574-1, 574-2, 574-3) in the y-direction (perpendicular to the x-z plane in FIG. 10). Each staircase step in y-direction includes two dielectric layer pairs 456. Accordingly, each staircase step in x-direction includes six dielectric layer pairs 456. The upper dielectric layer pair 456-1 of the staircase step 574-2 in the y-direction in the first staircase region 210a can become a lower dielectric layer pair in the staircase step 573-1 in the in y-direction in the second staircase region 210b. The lower dielectric layer pair 456-2 of staircase step 574-2 in the y-direction is covered in the first staircase region 210a. However due to an odd number of offset steps $N_{offset}$ between the staircase steps in the first and second staircase regions 210a and 210b, the lower dielectric layer pair 456-2 of the staircase step 574-2 in y-direction in the first staircase region 210a can become an upper dielectric layer pair in the staircase step 575-3 in the y-direction in the second staircase region 210b, and can be exposed from a top surface of the staircase step in the y-direction.

Figure 11:
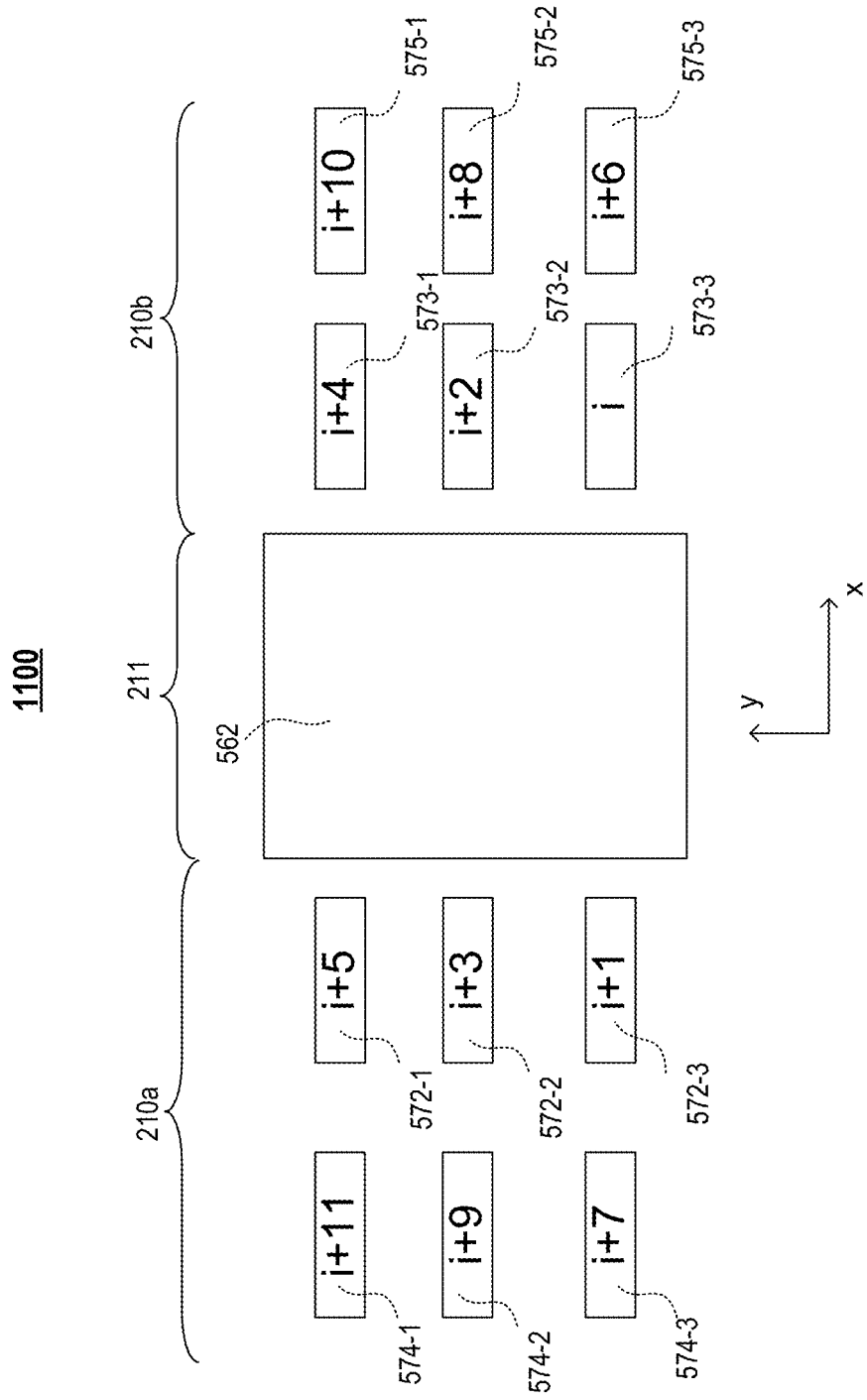
FIGS. 11-12 illustrate top-down views of 3D memory structures, according to some embodiments of the present disclosure.

In some embodiments, each staircase step in y-direction includes two dielectric layer pairs and the number of offset steps $N_{offset}$ between the first and second staircase region 210a and 210b can be one. In this example, access to each second dielectric layer 460 can alternate between first and second staircase region 210a and 210b. FIG. 11 illustrates a top-down view of a 3D memory structure 1100 having an arrangement of staircase structures that enable each dielectric layer pair 456 accessible from a top surface of a staircase step, according to some embodiments of the present disclosure. In this example, there are three staircase steps in y-direction for each staircase step along x-direction. Counting from top to bottom, the ith dielectric layer pair 456 can be accessed (or exposed) in the staircase step 573-3 in the y-direction in the second staircase region 210b. The (i+1)th dielectric layer pair 456 can be accessed (or exposed) in the staircase step 572-3 in the y-direction in the first staircase region 210a. Next, the (i+2)th dielectric layer pair 456 can be accessed (or exposed) in the staircase step 573-2 in the y-direction in the second staircase region 210b, and the (i+3)th dielectric layer pair 456 can be accessed (or exposed) in the staircase step 572-2 in the y-direction in the first staircase region 210a. Similarly, the (i+4)th dielectric layer pair 456 can be accessed (or exposed) in the staircase step 573-1 in the y-direction in the second staircase region 210b, and the (i+5)th dielectric layer pair 456 can be accessed (or exposed) in the staircase step 572-1 in the y-direction in the first staircase region 210a. The (i+6)th dielectric layer pair 456 can be accessed (or exposed) in the staircase step 575-3 in the y-direction in the second staircase region 210b, where the staircase step 575-3 is one step lower than the staircase step 573-3 in x-direction. The (i+7)th dielectric layer pair 456 can be accessed (or exposed) in the staircase step 574-3 in the y-direction in the first staircase region 210a, where the staircase step 574-3 is one step lower than the staircase step 572-3 in x-direction. In this example, each staircase step in y-direction includes two dielectric layer pairs, and thus the counting number for the dielectric layer pairs is increased by 2 in y-direction. In the x-direction, each staircase step includes six dielectric layer pairs because each of the three staircase steps in y-direction includes two dielectric layer pairs. Thus, the counting number is increased by 6 in x-direction.

In some embodiments, each staircase step in y-direction can include two or more number of dielectric layer pairs. In this example, staircase steps in the first and/or second sets of division blocks 566 and 568 can include an offset number of staircase steps such that each second dielectric layer that will be used for the control gate 333 in the subsequent processes can be exposed from a top surface of at least one of the staircase step, either in x- or y-direction, in the first or second staircase region 210a or 210b, or in one of the division blocks 566 or 568.

Figure 12:
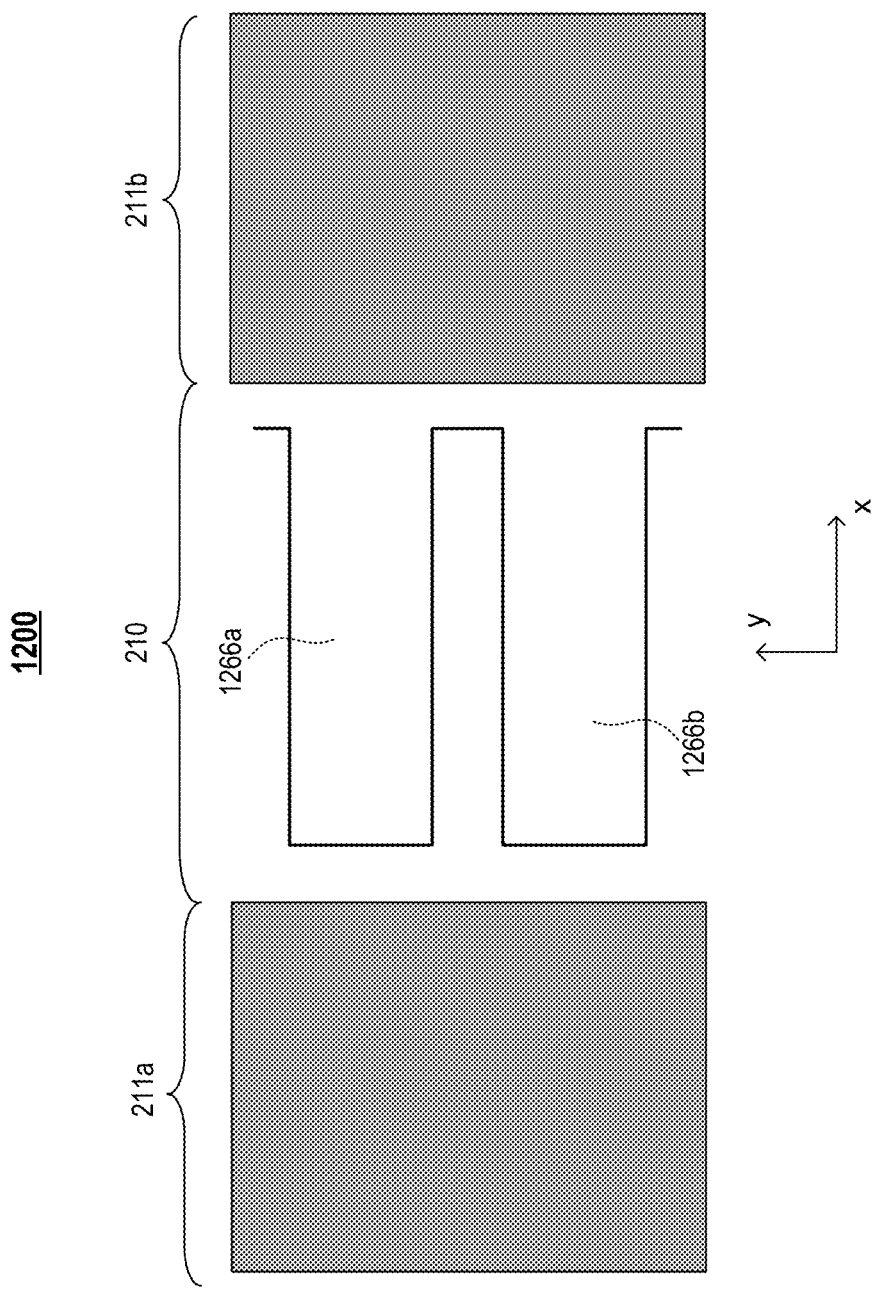

FIG. 12 shows a top-down schematic view of a 3D memory structure 1200 with a staircase region (e.g., the staircase region 210) located in between two channel structure regions 211a and 211b, according to some embodiments of the present disclosure. In this arrangement, one channel structure region (e.g., channel structure region 211b) is associated with one staircase region (e.g., the staircase region 210). When each staircase step in the y-direction includes two dielectric layer pairs (similar to the first plurality of staircase steps 572-1, 572-2 and 572-3 in FIG. 7), in order to access (or expose) each second dielectric layer for a top surface of a staircase step, an offset number $N_{offset}$ of staircase steps can be created between two division blocks (e.g., division blocks 1266a and 1266b) in the staircase region 210, where the offset number $N_{offset}$ can be one. In some embodiments, the division block 1266a can provide access to each even number of second dielectric layer (or dielectric layer pair) and the division block 1266b can provide access to each odd number of second dielectric layer (or dielectric layer pair). As a result, although each staircase step in the y-direction includes two or more dielectric layer pairs, through adjusting the offset number $N_{offset}$ of staircase steps between different division blocks, each second dielectric layer (or dielectric layer pair) can be exposed from a top surface of a staircase step.

Figure 13:
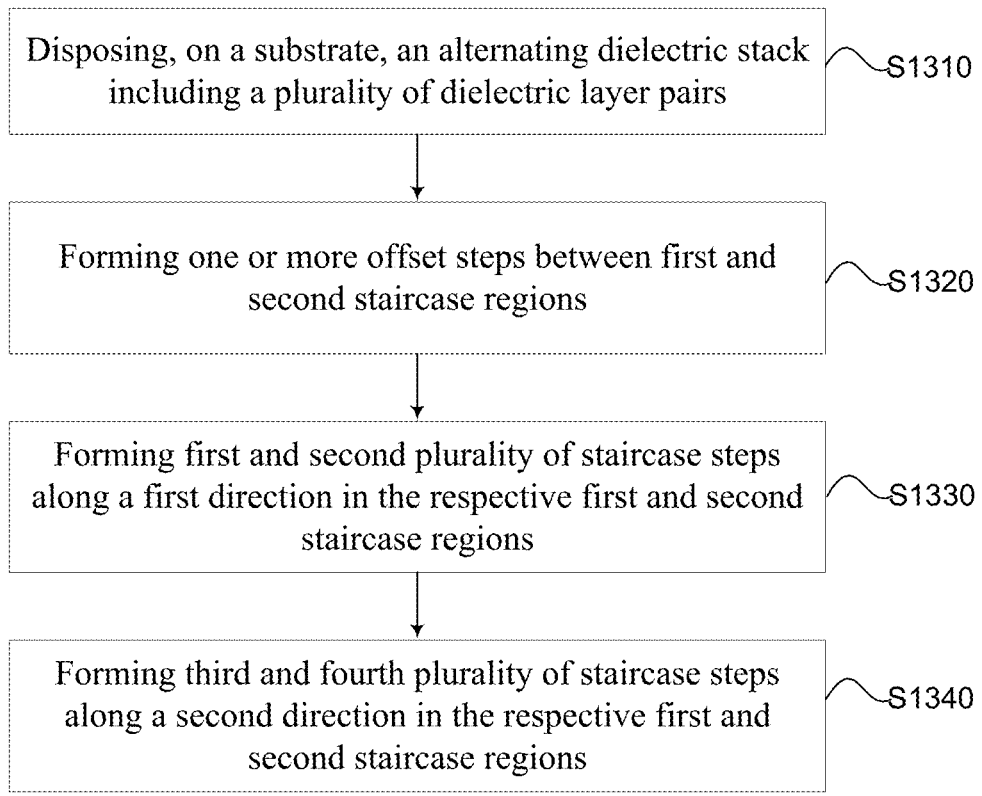
FIG. 13 illustrates a flow diagram of an exemplary method for forming a 3D memory structure in accordance with some embodiments of the present disclosure.

FIG. 13 illustrates an exemplary fabrication process 1300 for forming 3D memory devices shown in FIGS. 4-12, accordance to some embodiments of the present disclosure. It should be understood that the operations shown in fabrication process 1300 are not exhaustive and that other operations can be performed as well before, after, or between any of the illustrated operations. In some embodiments, some process steps of exemplary fabrication process 1300 can be omitted or other process steps can be included, which are not described here for simplicity. In some embodiments, process steps of fabrication process 1300 can be performed in a different order and/or vary.

As shown in FIG. 13, fabrication process 1300 starts at process step S1310, where an alternating dielectric stack is disposed on a substrate. An example of the alternating dielectric stack is illustrated in FIG. 4 (e.g., the alternating dielectric stack 454). The alternating dielectric stack includes a plurality of dielectric layer pairs. Each dielectric layer pair includes a first dielectric layer and a second dielectric layer that is different from the first dielectric layer. The first and second dielectric layers can be alternatingly stacked on top of each other in the alternating dielectric stack. The materials and methods used to form the alternating dielectric stack are described previously for FIG. 4 and 3D memory structure 400.

At process step S1320, one or more offset steps between a first staircase region and a second staircase region can be formed in the alternating dielectric stack. The number of offset steps $N_{offset}$ can be adjusted such that each second dielectric layer in the alternating dielectric stack intended for control gate or select gate in the subsequent processes can be accessible from a top surface of a staircase step. In an example associated with FIGS. 5 and 6, the number of offset steps $N_{offset}$ can be formed through a mask (e.g., the second staircase mask 665) that covers the first staircase region 210a and exposes the second staircase region 210b.

At process step S1330, first and second plurality of staircase steps in a first direction (e.g., y-direction) can be formed in the first and second staircase regions by using a staircase division pattern (SDP) mask and a repetitive etch-trim process. An example of the first and second plurality of staircase steps in the y-direction are shown in FIGS. 5 and 7 (e.g., 572-1, 572-2, and 572-3). In some embodiments, each of the first and second plurality of staircase steps in the y-direction includes two or more dielectric layer pairs. The etch-trim process includes an etching process and a trimming process. The etching process can include any suitable dry etch (e.g., RIE) or wet etch that are controllable through the first and second dielectric layers. For example, an etching chemistry can be used to etch the first dielectric layer selectively over the second dielectric layer and then another etching chemistry can be used to etch the second dielectric layer selectively over the first dielectric layer. An isotropic etching process can be used to trim the SDP mask laterally (e.g., in the x-y plane shown in FIGS. 5 and 6.) In some embodiments, the SDP mask includes multiple division patterns extending in a second direction (e.g., x-direction) and repeating along the first direction (e.g., y-direction). The SDP mask covers portions of the first and second staircase regions. An example of the SDP mask is shown in FIG. 6 (e.g., SDP mask 670).

At process step S1340, third and fourth plurality of staircase steps in the second direction (e.g., x-direction) can be formed in the first and second staircase regions, where the first and second directions are perpendicular to each other. An example of the third and fourth plurality of staircase steps in the x-direction are shown in FIGS. 8 and 10 (e.g., the staircase steps 572, 574, 576, and 573, 575). In this example, each of the third plurality of staircase steps in the x-direction includes three first plurality of staircase steps in the y-direction, and each of the fourth plurality of staircase steps in the x-direction includes three second plurality of staircase steps in the y-direction. When each staircase step in the y-direction includes two dielectric layer pairs, each staircase step in the x-direction can include six dielectric layer pairs. The third and fourth plurality of staircase steps in the x-direction can be formed using a similar etch-trim process described above for the staircase steps in the y-direction, where the etch time and process can be adjusted to etch through six dielectric layer pairs for a staircase step.

Fabrication processes to form a functional 3D memory can resume. For example, channel holes can be formed through the entire alternating dielectric stack. A memory film and a channel layer can disposed inside each channel hole. A film stack of alternating conductive and dielectric layers can also be formed by replacing the second dielectric layer with a conductive layer.

In summary, the present disclosure describes various embodiments of a 3D memory device and methods of making the same.

One aspect of the present disclosure provides a method for forming a three-dimensional (3D) memory device that includes disposing an alternating dielectric stack on a substrate. The alternating dielectric stack includes first and second dielectric layers alternatingly stacked on top of each other. The method also includes forming one or more offset steps between a first staircase region and a second staircase region, where the first and second staircase regions are located on opposite sides of a channel structure region. The method further includes forming first and second plurality of staircase steps along a first direction in the respective first and second staircase regions. Each of the first and second plurality of staircase steps has two or more dielectric layer pairs, and each dielectric layer pair has one first dielectric layer and one second dielectric layer. The method also includes forming third and fourth plurality of staircase steps along a second direction in the respective first and second staircase regions, where the second direction is perpendicular to the first direction. Each of the third plurality of staircase steps along the second direction includes the first plurality of staircase steps along the first direction, and each of the fourth plurality of staircase steps along the second direction includes the second plurality of staircase steps along the first direction.

Second aspect of the present disclosure provides a method for forming a three-dimensional (3D) memory device that includes disposing an alternating dielectric stack on a substrate, where the alternating dielectric stack includes first and second dielectric layers alternatingly stacked on top of each other. One pair of the first and second dielectric layers has a dielectric layer pair. The method also includes forming multiple division blocks in a staircase region. The multiple division blocks repeat in a first direction and extend in a second direction perpendicular to the first direction. Each of the multiple division blocks includes a first plurality of staircase steps along the first direction, and each of the first plurality of staircase steps includes two or more dielectric layer pairs. The method further includes forming a second plurality of staircase steps along the second direction in the staircase region. Each of the second plurality of staircase steps along the second direction includes the first plurality of staircase steps along the first direction.

Third aspect of the present disclosure provides a three-dimensional (3D) memory structure that includes an alternating dielectric stack disposed on a substrate, wherein the alternating dielectric stack includes alternatingly stacked first and second dielectric layers. The first dielectric layer is different from the second dielectric layer. The 3D memory structure also includes first and second sets of division blocks formed at edges of the alternating dielectric stack in first and second staircase regions, respectively, where the first and second staircase regions are located on opposite sides of a channel structure region. The second set of division blocks are located below the first set of division blocks by a first offset number of dielectric layer pairs. Each dielectric layer pair includes one first dielectric layer and one second dielectric layer. Each of the first and second sets of division blocks includes a first plurality of staircase steps in a first direction and a second plurality of staircase steps in a second direction perpendicular to the first direction. Each of the first plurality of staircase steps in the first direction has two or more dielectric layer pairs.

Fourth aspect of the present disclosure provides a three-dimensional (3D) memory structure that includes an alternating dielectric stack disposed on a substrate, where the alternating dielectric stack includes alternatingly stacked first and second dielectric layers. The first dielectric layer is different from the second dielectric layer. The 3D memory structure also includes multiple division blocks formed at an edge of the alternating dielectric stack in a staircase region, where the staircase region is located between two channel structure regions. The multiple division blocks has an offset number of dielectric layer pairs. Each dielectric layer pair has one first dielectric layer and one second dielectric layer and is accessible from a top surface of a staircase step. Each division block includes a first plurality of staircase steps in a first direction and a second plurality of staircase steps in a second direction perpendicular to the first direction. Each of the first plurality of staircase steps in the first direction includes two or more dielectric layer pairs.

The foregoing description of the specific embodiments will so fully reveal the general nature of the present disclosure that others can, by applying knowledge within the skill of the art, readily modify and/or adapt, for various applications, such specific embodiments, without undue experimentation, and without departing from the general concept of the present disclosure. Therefore, such adaptations and modifications are intended to be within the meaning and range of equivalents of the disclosed embodiments, based on the disclosure and guidance presented herein. It is to be understood that the phraseology or terminology herein is for the purpose of description and not of limitation, such that the terminology or phraseology of the present specification is to be interpreted by the skilled artisan in light of the disclosure and guidance.

Embodiments of the present disclosure have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The Summary and Abstract sections can set forth one or more but not all exemplary embodiments of the present disclosure as contemplated by the inventor(s), and thus, are not intended to limit the present disclosure and the appended claims in any way.

The breadth and scope of the present disclosure should not be limited by any of the above-described exemplary embodiments, but should be defined only in accordance with the following claims and their equivalents.

What is claimed is:

1. A method for forming a three-dimensional (3D) memory structure, comprising:
   disposing an alternating dielectric stack on a substrate, wherein the alternating dielectric stack comprises first and second dielectric layers alternatingly stacked on top of each other;
   forming one or more offset steps between a first staircase region and a second staircase region, wherein the first and second staircase regions are located on opposite sides of a channel structure region;
   forming first and second plurality of staircase steps along a first direction in the respective first and second staircase regions, wherein each of the first and second plurality of staircase steps comprises two or more dielectric layer pairs, each dielectric layer pair comprising one first dielectric layer and one second dielectric layer; and
   forming third and fourth plurality of staircase steps along a second direction in the respective first and second staircase regions, wherein
   the second direction is perpendicular to the first direction,
   each of the third plurality of staircase steps along the second direction comprises the first plurality of staircase steps along the first direction, and
   each of the fourth plurality of staircase steps along the second direction comprises the second plurality of staircase steps along the first direction.

2. The method of claim 1, wherein the forming the one or more offset steps comprises forming a staircase mask on the alternating dielectric stack to cover the first staircase region and expose the second staircase region.

3. The method of claim 2, wherein the forming the one or more offset steps further comprises forming the second and fourth plurality of staircase steps located $N_{offset}$ number of dielectric layer pairs below the respective first and third plurality of staircase steps such that each dielectric layer pair is accessible from a top surface of a staircase step.

4. The method of claim 3, wherein the forming the first and second plurality of staircase steps in the first direction comprises forming two dielectric layer pairs in each of the first and second plurality of staircase steps.

5. The method of claim 4, wherein the forming one or more offset steps comprises forming the second and fourth plurality of staircase steps located $N_{offset}$ number of dielectric layer pairs below the respective first and third plurality of staircase steps, $N_{offset}$ being an odd integer.

6. The method of claim 1, wherein the forming the first and second plurality of staircase steps along the first direction comprises forming first and second sets of division blocks in the respective first and second staircase regions, the first and second sets of division blocks repeating in the first direction and extending in the second direction.

7. The method of claim 6, wherein the forming the first and second plurality of staircase steps along the first direction comprises using a repetitive etch-trim process.

8. A method for forming a three-dimensional (3D) memory structure, comprising:
   disposing an alternating dielectric stack on a substrate, wherein the alternating dielectric stack comprises first and second dielectric layers alternatingly stacked on top of each other, wherein one pair of the first and second dielectric layers comprises a dielectric layer pair;
   forming multiple division blocks in a staircase region, wherein
   the multiple division blocks repeat in a first direction and extend in a second direction perpendicular to the first direction, and
   each of the multiple division blocks comprises a first plurality of staircase steps along the first direction, each of the first plurality of staircase steps comprising two or more dielectric layer pairs, and
   forming a second plurality of staircase steps along the second direction in the staircase region, wherein
   each of the second plurality of staircase steps along the second direction comprises the first plurality of staircase steps along the first direction.

9. The method of claim 8, further comprising forming one or more offset steps between the multiple division blocks, wherein the one or more offset steps comprise an offset number $N_{offset}$ of the dielectric layer pairs such that each dielectric layer pair is accessible from a top surface of a staircase step.

10. The method of claim 9, wherein the forming the one or more offset steps between the multiple division blocks comprises forming a block mask that covers a first division block and exposes a second division block.

11. The method of claim 10, wherein the forming the one or more offset steps comprises forming the second division block located below the first division block by an odd number of dielectric layer pairs when each of the first plurality of staircase steps in the first direction comprises two dielectric layer pairs.

12. A three-dimensional (3D) memory structure, comprising:
   an alternating dielectric stack disposed on a substrate, wherein the alternating dielectric stack comprises alternatingly stacked first and second dielectric layers, the first dielectric layer different from the second dielectric in material composition layer; and
   first and second sets of division blocks formed at edges of the alternating dielectric stack in first and second staircase regions, respectively, wherein
      the first and second staircase regions are located on opposite sides of a channel structure region,
      the second set of division blocks are located below the first set of division blocks by a first offset number of dielectric layer pairs, wherein each dielectric layer pair comprises one first dielectric layer and one second dielectric layer, and
      each of the first and second sets of division blocks comprises a first plurality of staircase steps in a first direction and a second plurality of staircase steps in a second direction perpendicular to the first direction, and each of the first plurality of staircase steps in the first direction comprises two or more dielectric layer pairs.

13. The 3D memory structure of claim 12, wherein the first plurality of staircase steps in the first direction are symmetrically distributed around the second direction on both sides of the second plurality of the staircase steps.

14. The 3D memory structure of claim 12, wherein the first plurality of staircase steps in the first direction comprises N number of staircase steps, and each of the first plurality of staircase steps comprising L number of dielectric layer pairs; and N and L each is a whole number.

15. The 3D memory structure of claim 14, wherein each of the second plurality of staircase steps in the second direction comprises M number of dielectric layer pairs, wherein M is a product of N and L.

16. The 3D memory structure of claim 12, wherein the first offset number of dielectric layer pairs between the first and second sets of division blocks is an odd integer when each of the first plurality of staircase steps in the first direction comprises two dielectric layer pairs.

17. The 3D memory structure of claim 12, further comprising a second offset number of dielectric layer pairs, wherein a first division block of the first or second set of division blocks is located below a second division block of the first or second set of division blocks by the second offset number of dielectric layer pairs.

18. A three-dimensional (3D) memory structure, comprising:
   an alternating dielectric stack disposed on a substrate, wherein the alternating dielectric stack comprises alternatingly stacked first and second dielectric layers, the first dielectric layer different from the second dielectric in material composition layer; and
   multiple division blocks formed at an edge of the alternating dielectric stack in a staircase region, wherein
      the staircase region is located between two channel structure regions,
      the multiple division blocks comprises an offset number of dielectric layer pairs, each dielectric layer pair comprising one first dielectric layer and one second dielectric layer and accessible from a top surface of a staircase step, and
      each division block comprises a first plurality of staircase steps in a first direction and a second plurality of staircase steps in a second direction perpendicular to the first direction, and each of the first plurality of staircase steps in the first direction comprises two or more dielectric layer pairs.

19. The 3D memory structure of claim 18, wherein:
the first plurality of staircase steps in the first direction comprises N number of staircase steps, each of the first plurality of staircase steps comprising L number of dielectric layer pairs and each of the second plurality of staircase steps in the second direction comprising M number of dielectric layer pairs, wherein:
   M is a product of N and L; and
   N and L each is a whole number.

20. The 3D memory structure of claim 18, wherein the offset number of dielectric layer pairs between a first division block and a second division block is an odd integer when each of the first plurality of staircase steps in the first direction comprises two dielectric layer pairs.

* * * * *

UNITED STATES PATENT AND TRADEMARK OFFICE
CERTIFICATE OF CORRECTION

PATENT NO. : 11,222,789 B2
APPLICATION NO. : 16/909537
DATED : January 11, 2022
INVENTOR(S) : Liu et al.

It is certified that error appears in the above-identified patent and that said Letters Patent is hereby corrected as shown below:

In the Claims

Column 9, Line 67, Claim 5: replace "458 and" with --458 in material composition and--.
Column 22, Line 29, Claim 12: replace "forming one" with --forming the one--.
Column 23, Line 20, Claim 13: replace "in material composition layer; and" with --layer in material composition; and--.
Column 23, Line 41, Claim 13: replace "of the staircase" with --of staircase--.
Column 24, Line 19, Claim 18: replace "in material composition layer; and" with --layer in material composition; and--.
Column 24, Line 24, Claim 18: replace "comprises" with --comprise--.

Signed and Sealed this
Twenty-fourth Day of May, 2022

Katherine Kelly Vidal
*Director of the United States Patent and Trademark Office*